United States Patent
Kim et al.

(10) Patent No.: US 8,921,831 B2
(45) Date of Patent: Dec. 30, 2014

(54) THIN FILM DEPOSITION APPARATUS, METHOD OF MANUFACTURING ORGANIC LIGHT-EMITTING DISPLAY DEVICE BY USING THE APPARATUS, AND ORGANIC LIGHT-EMITTING DISPLAY DEVICE MANUFACTURED BY USING THE METHOD

(75) Inventors: Jong-Heon Kim, Yongin (KR); Hyun-Sook Park, Yongin (KR); Jae-Kwang Ryu, Yongin (KR); Hee-Cheol Kang, Yongin (KR); Ji-Sook Oh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 373 days.

(21) Appl. No.: 12/836,760

(22) Filed: Jul. 15, 2010

(65) Prior Publication Data
US 2011/0042659 A1 Feb. 24, 2011

(30) Foreign Application Priority Data
Aug. 24, 2009 (KR) .................. 10-2009-0078171

(51) Int. Cl.
| | |
|---|---|
| *H01L 51/05* | (2006.01) |
| *C23C 14/04* | (2006.01) |
| *C23C 14/12* | (2006.01) |
| *C23C 14/24* | (2006.01) |
| *H01L 51/56* | (2006.01) |
| *H01L 51/00* | (2006.01) |

(52) U.S. Cl.
CPC .............. *C23C 14/042* (2013.01); *C23C 14/12* (2013.01); *H01L 51/0011* (2013.01); *C23C 14/243* (2013.01); *H01L 51/56* (2013.01)
USPC ................... 257/40; 438/34; 438/82; 438/89; 438/99; 438/780

(58) Field of Classification Search
CPC .... C23C 14/042; C23C 14/12; C23C 14/243; H01L 51/56; H01L 51/0011
USPC ........ 438/22, 24, 99, E51.008, E51.022, 758; 118/720; 257/40, E51.018, E51.026, 257/79, 257
See application file for complete search history.

(56) References Cited

U.S. PATENT DOCUMENTS

| | | | |
|---|---|---|---|
| 6,274,198 | B1 | 8/2001 | Dautartas |
| 6,371,451 | B1 | 4/2002 | Choi |

(Continued)

FOREIGN PATENT DOCUMENTS

| | | |
|---|---|---|
| CN | 1489419 A | 4/2004 |
| CN | 1500904 A | 6/2004 |

(Continued)

OTHER PUBLICATIONS

English-language abstract of Korean Publication No. 10-2007-0025164, Mar. 8, 2007.

(Continued)

*Primary Examiner* — Chuong A Luu
*Assistant Examiner* — Rodolfo Fortich
(74) *Attorney, Agent, or Firm* — Christie, Parker & Hale, LLP

(57) ABSTRACT

A thin film deposition apparatus that includes a thin film deposition assembly incorporating: a deposition source that discharges a deposition material; a deposition source nozzle unit that is disposed at a side of the deposition source and includes a plurality of deposition source nozzles arranged in a first direction; a patterning slit sheet that is disposed opposite to the deposition source nozzle unit and includes a plurality of patterning slits arranged in the first direction; and a barrier plate assembly including a plurality of barrier plates that are disposed between the deposition source nozzle unit and the patterning slit sheet in the first direction, and partition a space between the deposition source nozzle unit and the patterning slit sheet into a plurality of sub-deposition spaces, wherein each of the barrier plates is separate from the patterning slit sheet.

11 Claims, 13 Drawing Sheets

(56) References Cited

U.S. PATENT DOCUMENTS

| | | | |
|---|---|---|---|
| 6,749,906 B2 | 6/2004 | Van Slyke | |
| 6,837,939 B1 | 1/2005 | Klug et al. | |
| 7,015,154 B2 * | 3/2006 | Yamazaki et al. | 438/795 |
| 7,273,526 B2 | 9/2007 | Shinriki et al. | |
| 7,677,195 B2 | 3/2010 | Lee et al. | |
| 8,006,639 B2 * | 8/2011 | Kim et al. | 118/723 HC |
| 2001/0006827 A1 | 7/2001 | Yamazaki et al. | |
| 2002/0076847 A1 | 6/2002 | Yamada et al. | |
| 2002/0168577 A1 | 11/2002 | Yoon | |
| 2003/0101937 A1 | 6/2003 | Van Slyke et al. | |
| 2003/0168013 A1 | 9/2003 | Freeman et al. | |
| 2003/0221614 A1 | 12/2003 | Kang et al. | |
| 2004/0115338 A1 * | 6/2004 | Yoneda | 427/66 |
| 2004/0115339 A1 * | 6/2004 | Ito | 427/66 |
| 2004/0127066 A1 | 7/2004 | Jung | |
| 2004/0134428 A1 | 7/2004 | Sasaki et al. | |
| 2004/0142108 A1 | 7/2004 | Atobe et al. | |
| 2004/0144321 A1 | 7/2004 | Grace et al. | |
| 2004/0194702 A1 | 10/2004 | Sasaki et al. | |
| 2005/0016461 A1 | 1/2005 | Klug et al. | |
| 2005/0031836 A1 | 2/2005 | Hirai | |
| 2005/0037136 A1 | 2/2005 | Yamamoto | |
| 2005/0166842 A1 | 8/2005 | Sakamoto | |
| 2005/0257745 A1 * | 11/2005 | Abiko et al. | 118/726 |
| 2006/0144325 A1 | 7/2006 | Jung et al. | |
| 2006/0174829 A1 | 8/2006 | An et al. | |
| 2006/0205101 A1 | 9/2006 | Lee et al. | |
| 2007/0077358 A1 | 4/2007 | Jeong et al. | |
| 2007/0176534 A1 | 8/2007 | Abiko et al. | |
| 2007/0178708 A1 * | 8/2007 | Ukigaya | 438/758 |
| 2008/0018236 A1 | 1/2008 | Arai et al. | |
| 2008/0050521 A1 | 2/2008 | Ma et al. | |
| 2008/0115729 A1 | 5/2008 | Oda et al. | |
| 2008/0131587 A1 | 6/2008 | Boroson et al. | |
| 2008/0216741 A1 | 9/2008 | Ling et al. | |
| 2009/0017192 A1 | 1/2009 | Matsuura | |
| 2009/0232976 A1 | 9/2009 | Yoon et al. | |
| 2010/0297348 A1 | 11/2010 | Lee et al. | |
| 2011/0053301 A1 * | 3/2011 | Kang et al. | 438/34 |

FOREIGN PATENT DOCUMENTS

| | | |
|---|---|---|
| EP | 1 413 644 | 4/2004 |
| EP | 1 418 250 A2 | 5/2004 |
| EP | 1 518 940 | 3/2005 |
| JP | 4-272170 | 9/1992 |
| JP | 11-100663 | 4/1999 |
| JP | 2000-68054 | 3/2000 |
| JP | 2001-52862 | 2/2001 |
| JP | 2001-93667 | 4/2001 |
| JP | 2001-287328 | 10/2001 |
| JP | 2002-175878 | 6/2002 |
| JP | 2003-3250 | 1/2003 |
| JP | 2003-77662 | 3/2003 |
| JP | 2003-157973 | 5/2003 |
| JP | 2003-297562 | 10/2003 |
| JP | 2004-43898 | 2/2004 |
| JP | 2004-103269 | 4/2004 |
| JP | 2004-103341 | 4/2004 |
| JP | 2004-199919 | 7/2004 |
| JP | 2005-44592 | 2/2005 |
| JP | 2005-235568 | 9/2005 |
| JP | 2005-293968 | 10/2005 |
| JP | 2005-296737 | 10/2005 |
| JP | 2005-330551 | 12/2005 |
| JP | 2006-275433 | 10/2006 |
| JP | 2007-47293 | 2/2007 |
| JP | 2008-121098 | 5/2008 |
| JP | 2009-19243 | 1/2009 |
| JP | 2009-87910 | 4/2009 |
| KR | 10-0257219 | 2/2000 |
| KR | 10-2000-0019254 | 4/2000 |
| KR | 10-2000-0023929 | 5/2000 |
| KR | 10-2001-0059939 | 7/2001 |
| KR | 10-2002-0000201 | 1/2002 |
| KR | 10-2002-0050922 | 6/2002 |
| KR | 10-2002-0090934 | 12/2002 |
| KR | 10-2004-0034537 | 4/2003 |
| KR | 10-0405080 | 10/2003 |
| KR | 10-2003-0091947 | 12/2003 |
| KR | 10-2003-0093959 | 12/2003 |
| KR | 10-2004-0050045 | 6/2004 |
| KR | 10-2004-0069281 | 8/2004 |
| KR | 10-2004-0084747 | 10/2004 |
| KR | 10-0463212 | 12/2004 |
| KR | 10-0520159 | 9/2005 |
| KR | 10-2006-0008602 | 1/2006 |
| KR | 10-2006-0018745 | 3/2006 |
| KR | 10-2006-0073367 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0104675 | 10/2006 |
| KR | 10-2006-0104677 | 10/2006 |
| KR | 10-2006-0109627 | 10/2006 |
| KR | 10-0646160 | 11/2006 |
| KR | 10-0687007 | 2/2007 |
| KR | 10-2007-0025164 | 3/2007 |
| KR | 10-0696547 | 3/2007 |
| KR | 10-0698033 | 3/2007 |
| KR | 10-0700466 | 3/2007 |
| KR | 10-2007-0035796 | 4/2007 |
| KR | 10-0711885 | 4/2007 |
| KR | 10-2007-0050793 | 5/2007 |
| KR | 10-0723627 | 5/2007 |
| KR | 10-0726132 | 6/2007 |
| KR | 10-2007-0078713 | 8/2007 |
| KR | 10-2007-0080635 | 8/2007 |
| KR | 10-2007-0101842 | 10/2007 |
| KR | 10-2007-0105595 | 10/2007 |
| KR | 10-0770653 | 10/2007 |
| KR | 10-2008-0001184 | 1/2008 |
| KR | 10-0797787 | 1/2008 |
| KR | 10-0800125 | 1/2008 |
| KR | 10-0815265 | 3/2008 |
| KR | 10-0823508 | 4/2008 |
| KR | 10-0827760 | 4/2008 |
| KR | 10-0839380 | 6/2008 |
| KR | 10-2008-0060400 | 7/2008 |
| KR | 10-2008-0061132 | 7/2008 |
| KR | 10-2008-0062212 | 7/2008 |
| KR | 10-2008-0078290 | 8/2008 |
| KR | 10-2009-0038733 | 4/2009 |
| KR | 10-2009-0097453 | 9/2009 |

OTHER PUBLICATIONS

English-language abstract of Korean Publication No. 10-2007-0050793, May 16, 2007.

English-language abstract of Korean Publication No. KR 10-2002-0034272, Sep. 5, 2002.

English-language abstract of Korean Publication No. KR 10-2002-0056238, Jul. 10, 2002.

English-language abstract of Korean Publication No. KR 10-2002-0088662, Nov. 29, 2002.

English-language abstract of Korean Publication No. KR 10-2005-0045619, Jun. 17, 2005.

English-language abstract of Korean Publication No. KR 10-2006-0126267, Dec. 7, 2006.

English-language abstract of Korean Publication No. KR 10-2008-0038650, May 7, 2008.

U.S. Appl. No. 12/784,774, filed May 21, 2010, Choong-Ho Lee et al., Samsung Mobile Display Co., Ltd.

U.S. Appl. No. 13/014,225, filed Jan. 26, 2011, Jong-Won Hong et al., Samsung Mobile Display Co., Ltd.

U.S. Appl. No. 12/797,858, filed Jun. 10, 2010, Choong-Ho Lee et al., Samsung Mobile Display Co., Ltd.

U.S. Appl. No. 12/784,804, filed May 21, 2010, Choong-Ho Lee, et al., Samsung Mobile Display Co., Ltd.

U.S. Appl. No. 12/849,193, filed Aug. 3, 2010, Ji-Sook Oh et al., Samsung Mobile Display Co., Ltd.

(56) References Cited

OTHER PUBLICATIONS

U.S. Appl. No. 12/979,193, filed Dec. 28, 2010, Hyun Sook Park et al., Samsung Mobile Display Co., Ltd.
U.S. Appl. No. 12/820,355, filed Jun. 22, 2010, Yong-Sup Choi et al., Samsung Mobile Display Co., Ltd.
U.S. Appl. No. 12/950,361, filed Nov. 19, 2010, Choong-Ho Lee, et al., Samsung Mobile Display Co., Ltd.
U.S. Appl. No. 12/795,896, filed Jun. 8, 2010, Jung-Min Lee, et al., Samsung Mobile Display Co., Ltd.
U.S. Appl. No. 12/856,942, filed Aug. 16, 2010, Yun-Mi Lee et al., Samsung Mobile Display Co., Ltd.
U.S. Appl. No. 12/814,816, filed Jun. 14, 2010, Jung-Min Lee et al., Samsung Mobile Display Co., Ltd.
U.S. Appl. No. 12/868,099, filed Aug. 25, 2010, Hee-Cheol Kang, et al., Samsung Mobile Display Co., Ltd.
U.S. Appl. No. 12/862,153, filed Aug. 24, 2010, Hee-Cheol Kang, et al., Samsung Mobile Display Co., Ltd.
U.S. Appl. No. 12/869,830, filed Aug. 27, 2010, Chang-Mog Jo, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, filed Sep. 1, 2010, Young-Mook Choi, et al., Samsung Mobile Display Co., Ltd.
U.S. Appl. No. 12/815,673, filed Jun. 15, 2010, Jung-Min Lee, Samsung Mobile Display Co., Ltd.
U.S. Appl. No. 12/794,093, filed Jun. 4, 2010, Jung-Min Lee et al., Samsung Mobile Display Co., Ltd.
U.S. Appl. No. 12/862,125, filed Aug. 24, 2010, Jae-Kwang Ryu et al., Samsung Mobile Display Co., Ltd.
U.S. Appl. No. 12/795,001, filed Jun. 7, 2010, Choong-Ho Lee et al., Samsung Mobile Display Co., Ltd.
U.S. Appl. No. 12/813,786, filed Jun. 11, 2010, Choong-Ho Lee et al., Samsung Mobile Display Co., Ltd.
U.S. Appl. No. 12/820,270, filed Jun. 22, 2010, Jung-Min Lee et al., Samsung Mobile Display Co., Ltd.
U.S. Appl. No. 12/907,396, filed Oct. 19, 2010, Yong-Sup Choi, et al., Samsung Mobile Display Co., Ltd.
U.S. Appl. No. 12/987,569, filed Jan. 10, 2011, Yun-Mi Lee et al., Samsung Mobile Display Co., Ltd.
U.S. Appl. No. 12/984,289, filed Jan. 4, 2011, Jung-Yeong Kim et al., Samsung Mobile Display Co., Ltd.
U.S. Appl. No. 13/031,756, filed Feb. 22, 2011, Yong Sup Choi et al., Samsung Mobile Display Co., Ltd.
U.S. Office action dated Sep. 24, 2012, for cross reference U.S. Appl. No. 12/797,858, (20 pages).
KIPO Office action dated Aug. 1, 2011, for Korean priority Patent application 10-2009-0078171, 4 pages.
U.S. Notice of Allowance dated Feb. 12, 2013, for cross reference U.S. Appl. No. 12/797,858, (8 pages).
U.S. Office action dated Aug. 26, 2013, for cross reference U.S. Appl. No. 13/175,626, (30 pages).
SIPO Office action dated Jan. 16, 2014, for corresponding Chinese Patent application 201010262640.1, (12 pages).

* cited by examiner

THIN FILM DEPOSITION APPARATUS, METHOD OF MANUFACTURING ORGANIC LIGHT-EMITTING DISPLAY DEVICE BY USING THE APPARATUS, AND ORGANIC LIGHT-EMITTING DISPLAY DEVICE MANUFACTURED BY USING THE METHOD

CROSS-REFERENCE TO RELATED APPLICATION

This application claims the benefit of Korean Application No. 10-2009-0078171, filed Aug. 24, 2009 in the Korean Intellectual Property Office, the disclosure of which is incorporated herein by reference.

BACKGROUND OF THE INVENTION

1. Field of the Invention

Aspects of the present invention relate to a thin film deposition apparatus, a method of manufacturing an organic light-emitting display device by using the thin film deposition apparatus, and an organic light-emitting display device manufactured by using the method. More particularly, aspects of the present invention relate to a thin film deposition apparatus that is suitable for manufacturing large-sized display devices on a mass scale and that can be used for high-definition patterning, a method of manufacturing an organic light-emitting display device by using the thin film deposition apparatus, and an organic light-emitting display device manufactured by using the method.

2. Description of the Related Art

Organic light-emitting display devices have a larger viewing angle, better contrast characteristics, and a faster response rate than other display devices, and thus have drawn attention as next-generation display devices. Such organic light-emitting display devices include intermediate layers, including an emission layer disposed between a first electrode and a second electrode that are arranged opposite to each other. The first and second electrodes and the intermediate layers may be formed by using various methods, one of which is a deposition method. When an organic light-emitting display device is manufactured by using the deposition method, a fine metal mask (FMM) having the same pattern as the thin film to be formed is disposed to closely contact a substrate, and a thin film material is deposited over the FMM in order to form the thin film having the desired pattern.

However, the deposition method using such an FMM is not suitable for manufacturing larger devices using a mother glass having a size of 5G or greater. In other words, the larger the mother glass, the larger the FMM. Thus, when such a large FMM is used, the FMM may bend due to gravity, thereby distorting the pattern. This is not conducive with the recent trend toward high-definition patterns.

SUMMARY OF THE INVENTION

Aspects of the present invention provide a thin film deposition apparatus that is suitable for manufacturing large-sized display devices on a mass scale and that can be used for high-definition patterning, a method of manufacturing an organic light-emitting display device by using the thin film deposition apparatus, and an organic light-emitting display device manufactured by using the method.

An aspect of the present invention provides a thin film deposition apparatus including a thin film deposition assembly, wherein the thin film deposition assembly includes: a deposition source that discharges a deposition material; a deposition source nozzle unit that is disposed at a side of the deposition source and includes a plurality of deposition source nozzles arranged in a first direction; a patterning slit sheet that is disposed opposite to the deposition source nozzle unit and includes a plurality of patterning slits arranged in the first direction; and a barrier plate assembly including a plurality of barrier plates that are disposed between the deposition source nozzle unit and the patterning slit sheet in the first direction, and partition the space between the deposition source nozzle unit and the patterning slit sheet into a plurality of sub-deposition spaces, wherein each of the barrier plates is separate from the patterning slit sheet.

The thin film deposition apparatus may further include a chuck that fixedly supports a substrate to be subjected to deposition, wherein the thin film deposition assembly may deposit a thin film on the substrate fixedly supported by the chuck.

The thin film deposition assembly may be separate from the substrate fixedly supported by the chuck, and the thin film deposition assembly or the substrate fixedly supported by the chuck may be movable relative to the other.

The thin film deposition apparatus may further include a barrier plates temperature control unit that controls the temperature of the barrier plates.

The barrier plates temperature control unit may maintain the barrier plates at a low temperature while the thin film deposition assembly deposits a thin film on the substrate fixedly supported by the chuck, and at a high temperature while the thin film deposition assembly does not deposit a thin film on the substrate fixedly supported by the chuck.

The barrier plates temperature control unit may control the temperature of the barrier plates to be higher while the thin film deposition assembly does not deposit a thin film on the substrate fixedly supported by the chuck than while the thin film deposition assembly deposits a thin film on the substrate fixedly supported by the chuck.

The barrier plates temperature control unit may maintain the temperature of the barrier plates to be lower than the vaporization temperature of the deposition material while the thin film deposition assembly deposits a thin film on the substrate fixedly supported by the chuck, and to be higher than the vaporization temperature of the deposition material while the thin film deposition assembly does not deposit a thin film on the substrate fixedly supported by the chuck.

The distance from the patterning slit sheet to the end of the barrier plates close to the patterning slit sheet may be greater than the length of the barrier plates.

The plurality of barrier plates may be arranged at equal intervals.

The deposition source and the barrier plate assembly may be separate from each other.

Another aspect of the present invention provides a thin film deposition apparatus including a thin film deposition assembly, wherein the thin film deposition assembly includes: a deposition source that includes an opening and discharges a deposition material contained therein; a deposition source nozzle unit that is disposed at a side of the deposition source to cover the opening of the deposition source and includes a plurality of deposition source nozzles arranged in a first direction, the deposition source nozzle unit having a planar shape; a patterning slit sheet that is disposed opposite to the deposition source nozzle unit and includes a plurality of patterning slits arranged in the first direction; and a plurality of barrier pipes that are disposed on a surface of the deposition source nozzle unit facing the patterning slit sheet or on a surface of the deposition source nozzle unit opposite to the patterning slit sheet of the deposition source, the plurality of barrier pipes respectively corresponding to the plurality of deposition source nozzles, wherein each of the barrier plates is separate from the patterning slit sheet.

The thin film deposition apparatus may further include a chuck that fixedly supports a substrate to be subjected to deposition, wherein the thin film deposition assembly deposits a thin film on the substrate fixedly supported by the chuck.

The thin film deposition assembly may be separate from the substrate fixedly supported by the chuck, and the thin film deposition assembly or the substrate fixedly supported by the chuck may be movable relative to the other.

The thin film deposition apparatus may further include a barrier pipes temperature control unit that controls the temperature of the barrier pipes.

The barrier pipes temperature control unit may maintain the barrier pipes at a low temperature while the thin film deposition assembly deposits a thin film on the substrate fixedly supported by the chuck, and at a high temperature while the thin film deposition assembly does not deposit a thin film on the substrate fixedly supported by the chuck.

The barrier pipes temperature control unit may control the temperature of the barrier pipes to be higher while the thin film deposition assembly does not deposit a thin film on the substrate fixedly supported by the chuck than while the thin film deposition assembly deposits a thin film on the substrate fixedly supported by the chuck.

The barrier pipes temperature control unit may maintain the temperature of the barrier pipes to be lower than the vaporization temperature of the deposition material while the thin film deposition assembly deposits a thin film on the substrate fixedly supported by the chuck, and to be higher than the vaporization temperature of the deposition material while the thin film deposition assembly does not deposit a thin film on the substrate fixedly supported by the chuck.

The barrier pipes may be arranged on the surface of the deposition source nozzle unit facing the patterning slit sheet, and the distance from the patterning slit sheet to an end of the barrier pipes close to the patterning slit sheet may be greater than a length of the barrier pipes.

The plurality of barrier pipes may be arranged at equal intervals.

The deposition source nozzle unit may include a cooling plate, and the barrier pipes may include a hot wire.

Another aspect of the present invention provides a thin film deposition apparatus including a thin film deposition assembly, wherein the thin film deposition assembly includes: a deposition source that discharges a deposition material; a deposition source nozzle unit that is disposed at a side of the deposition source and includes a plurality of deposition source nozzles arranged in a first direction; a patterning slit sheet that is disposed opposite to the deposition source nozzle unit and includes a plurality of patterning slits arranged in the first direction; and a barrier nozzle unit including a plurality of barrier nozzles that are disposed between the deposition source nozzle unit and the patterning slit sheet in the first direction, and partition a space between the deposition source nozzle unit and the patterning slit sheet into a plurality of sub-deposition spaces, wherein the barrier nozzle unit is separate from the patterning slit sheet.

The thin film deposition apparatus may further include a chuck that fixedly supports a substrate to be subjected to deposition, wherein the thin film deposition assembly may deposit a thin film on the substrate fixedly supported by the chuck.

The thin film deposition assembly may be separate from the substrate fixedly supported by the chuck, and the thin film deposition assembly or the substrate fixedly supported by the chuck may be movable relative to the other.

The thin film deposition apparatus may further include a barrier nozzle temperature control unit that controls the temperature of the barrier nozzle unit.

The barrier nozzle temperature control unit may maintain the barrier nozzle unit at a low temperature while the thin film deposition assembly deposits a thin film on the substrate fixedly supported by the chuck, and at a high temperature while the thin film deposition assembly does not deposit a thin film on the substrate fixedly supported by the chuck.

The barrier nozzle temperature control unit may control the temperature of the barrier nozzle unit to be higher while the thin film deposition assembly does not deposit a thin film on the substrate fixedly supported by the chuck than while the thin film deposition assembly deposits a thin film on the substrate fixedly supported by the chuck.

The barrier nozzle temperature control unit may maintain the temperature of the barrier nozzle unit to be lower than a vaporization temperature of the deposition material while the thin film deposition assembly deposits a thin film on the substrate fixedly supported by the chuck, and to be higher than the vaporization temperature of the deposition material while the thin film deposition assembly does not deposit a thin film on the substrate fixedly supported by the chuck.

The distance from the patterning slit sheet to the end of the barrier nozzle unit close to the patterning slit sheet may be greater than a length of the barrier nozzle unit.

The plurality of barrier nozzles may be arranged at equal intervals.

The deposition source and the barrier nozzle unit may be separate from each other.

Another aspect of the present invention provides a method of manufacturing an organic light-emitting display device by using a thin film deposition apparatus including a thin film deposition assembly, wherein the thin film deposition assembly includes: a deposition source that discharges a deposition material; a deposition source nozzle unit that is disposed at a side of the deposition source and includes a plurality of deposition source nozzles arranged in a first direction; a patterning slit sheet that is disposed opposite to the deposition source nozzle unit and includes a plurality of patterning slits arranged in the first direction; and a barrier plate assembly including a plurality of barrier plates that are disposed between the deposition source nozzle unit and the patterning slit sheet in the first direction, and partition a space between the deposition source nozzle unit and the patterning slit sheet into a plurality of sub-deposition spaces, and wherein the thin film deposition assembly is separate from a substrate fixedly supported by a chuck, and the thin film deposition assembly or the substrate fixedly supported by the chuck is movable relative to the other while deposition is performed on the substrate.

Another aspect of the present invention provides a method of manufacturing an organic light-emitting display device by using a thin film deposition apparatus including a thin film deposition assembly, wherein the thin film deposition assembly includes: a deposition source that includes an opening and discharges a deposition material contained therein; a deposition source nozzle unit that is disposed at a side of the deposition source and includes a plurality of deposition source nozzles arranged in a first direction; a patterning slit sheet that is disposed opposite to the deposition source nozzle unit and includes a plurality of patterning slits arranged in the first direction; and a plurality of barrier pipes that are disposed on a surface of the deposition source nozzle unit facing the patterning slit sheet or on a surface of the deposition source nozzle unit opposite to the patterning slit sheet of the deposition source, the plurality of barrier pipes respectively corresponding to the plurality of deposition source nozzles, and wherein the thin film deposition assembly is separate from a substrate fixedly supported by a chuck, and the thin film deposition assembly or the substrate fixedly supported by the chuck is movable relative to the other while deposition is performed on the substrate.

Another aspect of the present invention provides a method of manufacturing an organic light-emitting display device by using a thin film deposition apparatus including a thin film deposition assembly, wherein the thin film deposition assembly includes: a deposition source that discharges a deposition material; a deposition source nozzle unit that is disposed at a side of the deposition source and includes a plurality of deposition source nozzles arranged in a first direction; a patterning slit sheet that is disposed opposite to the deposition source nozzle unit and includes a plurality of patterning slits arranged in the first direction; and a barrier nozzle unit including a plurality of barrier nozzles that are disposed between the deposition source nozzle unit and the patterning slit sheet in the first direction, and partition a space between the deposition source nozzle unit and the patterning slit sheet into a plurality of sub-deposition spaces, and wherein the thin film deposition assembly is separate from a substrate fixedly supported by a chuck, and the thin film deposition assembly or the substrate fixedly supported by the chuck is movable relative to the other while deposition is performed on the substrate.

Other aspects of the present invention provide an organic light-emitting display device manufactured using any one of the methods described above.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
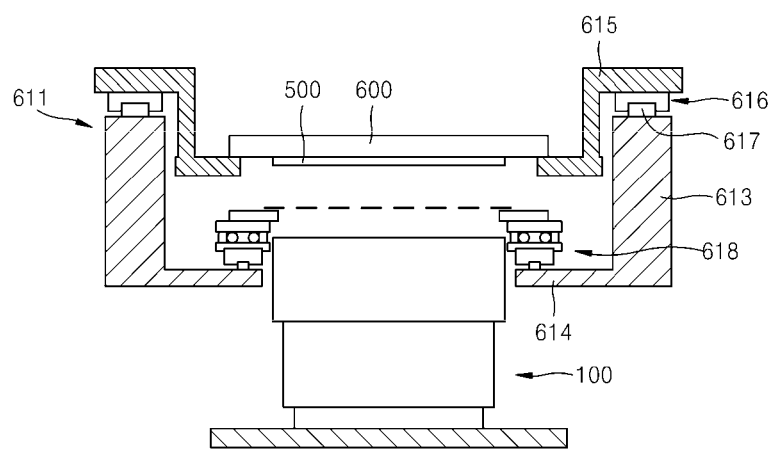
FIG. 1 is a schematic cross-sectional view of a thin film deposition apparatus including a thin film deposition assembly, according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where is stated herein that one structure is "formed on" or "disposed on" a second structure, the first structure may be formed or disposed directly on the second structure or there may be an intervening structure between the first structure and the second structure. Further, as used herein, the term "formed on" is used with the same meaning as "located on" or "disposed on" and is not meant to be limiting regarding any particular fabrication process.

Figure 2:
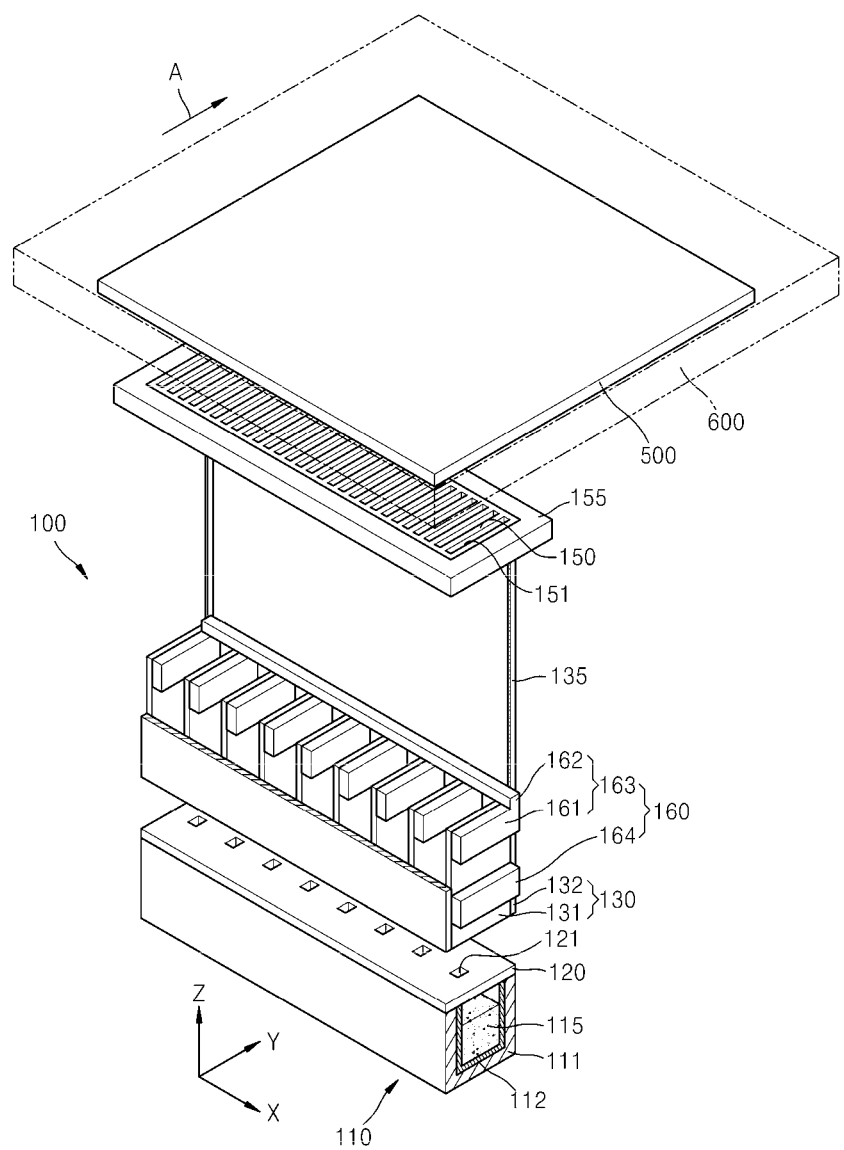
FIG. 2 is a schematic perspective view of the thin film deposition assembly of FIG. 1.
Figure 3:
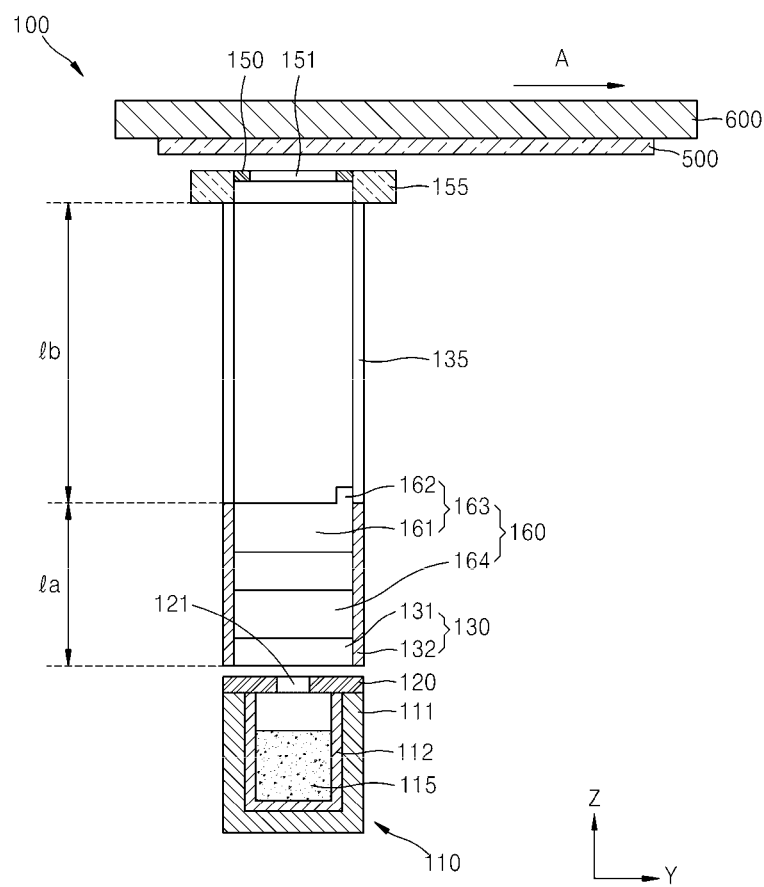
FIG. 3 is a schematic side cross-sectional view of the thin film deposition assembly of FIG. 2.
Figure 4:
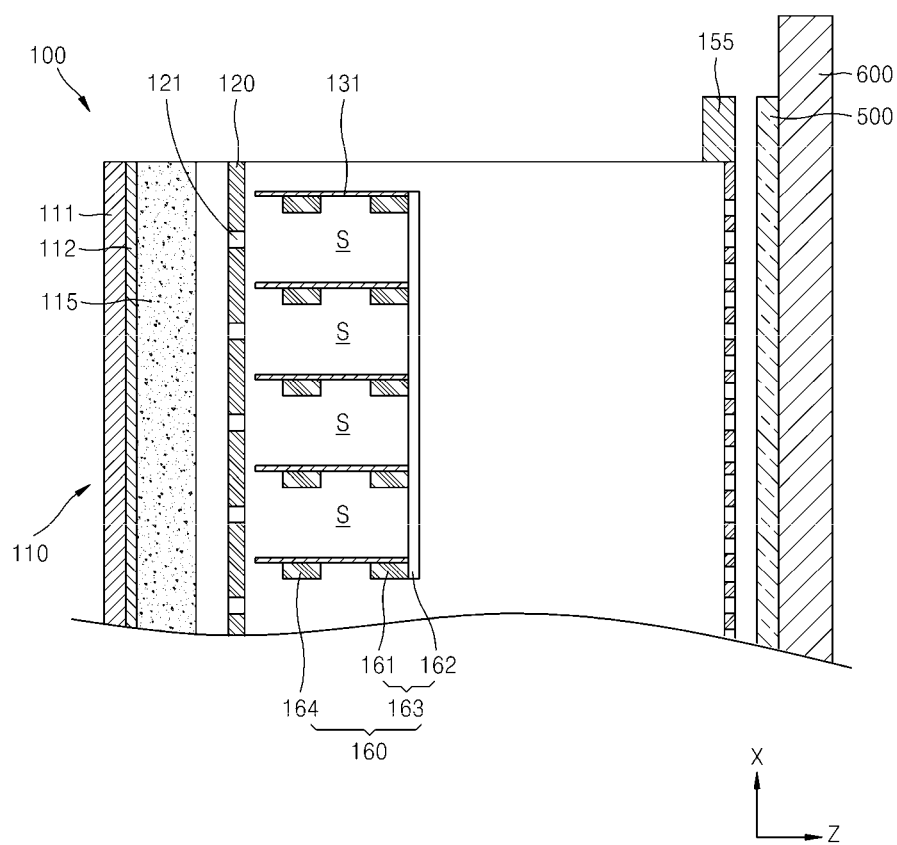
FIG. 4 is a schematic plan cross-sectional view of the thin film deposition assembly of FIG. 2.

FIG. 1 is a schematic cross-sectional view of a thin film deposition apparatus including a thin film deposition assembly 100, according to an embodiment of the present invention, FIG. 2 is a schematic perspective view of the thin film deposition assembly 100 of FIG. 1, FIG. 3 is a schematic side cross-sectional view of the thin film deposition assembly 100 of FIG. 2, and FIG. 4 is a schematic plan cross-sectional view of the thin film deposition assembly 100 of FIG. 2.

The thin film deposition apparatus according to the current embodiment of the present invention includes the thin film deposition assembly 100. Although a chamber is not illustrated in FIGS. 1-4 for convenience of explanation, the thin film deposition assembly 100 may be disposed within a chamber that is maintained at an appropriate degree of vacuum. The chamber is maintained at an appropriate vacuum in order to allow a deposition material to move in a straight direction.

The thin film deposition assembly 100 according to the current embodiment of the present invention includes a deposition source 110, a deposition source nozzle unit 120, a barrier plate assembly 130, and a patterning slit sheet 150.

The deposition source 110 may discharge a deposition material 115. In particular, the deposition source 110 includes a crucible 112 that is filled with the deposition material 115, and a cooling block 111 surrounding the crucible 112. The cooling block 111 prevents radiation of heat from the crucible outside, i.e., into the chamber. The cooling block 111 may include a heater (not shown) that heats the crucible 111.

The deposition source nozzle unit 120 is disposed at a side of the deposition source 110, and in particular, at the side of the deposition source 110 facing a substrate 500 on which the deposition material 115 discharged from the deposition source 110 is to be deposited. The deposition source nozzle unit 120 includes a plurality of deposition source nozzles 121 arranged in a first, X-axis direction, as illustrated in FIG. 2. The plurality of deposition source nozzles 121 may be arranged at equal intervals. The deposition material 115 that is vaporized in the deposition source 110 passes through the deposition source nozzles 121 of the deposition source nozzle unit 120 toward the substrate 500, which constitutes a target on which the deposition material 115 is to be deposited. The substrate 500 may be a substrate for flat panel displays. A large substrate, such as a mother glass, for manufacturing a plurality of flat panel displays, may be used as the substrate 500.

The patterning slit sheet 150 is disposed opposite to the deposition source nozzle unit 120 and comprises a plurality of patterning slits 151 arranged in a first direction, i.e. the X-axis direction. The thin film deposition assembly 100 may further include a frame 155 supporting the patterning slit sheet 150, as illustrated in FIG. 2. The frame 155 may be formed in a lattice shape, similar to a window frame. The patterning slit sheet 150 is bound inside the frame 155. Each of the patterning slits 151 extends in a second direction, i.e., the Y-axis direction in FIG. 2, intersecting the first direction. The deposition material 115 that has been vaporized in the deposition source 110 and has passed through the deposition source nozzle 121 passes through the patterning slits 151 toward the substrate 500.

The patterning slit sheet 150 may be formed of a metal thin film. The patterning slit sheet 150 is fixed to the frame 150 such that a tensile force is exerted thereon. The patterning slits 151 may be formed by etching the patterning slit sheet 150 to a stripe pattern. The total number of patterning slits 151 may be greater than the total number of deposition source nozzles 121. This will be described later.

The barrier plate assembly 130 is disposed between the deposition source nozzle unit 120 and the patterning slit sheet 150 in a third, Z direction, and comprises a plurality of barrier plates 131 that partition the space between the deposition source nozzle unit 120 and the patterning slit sheet 150 into a plurality of sub-deposition spaces S. In the thin film deposition assembly 100 according to the current embodiment of the present invention, the deposition space is divided by the barrier plates 131 into the sub-deposition spaces S that respectively correspond to the deposition source nozzles 121 through which the deposition material 115 is discharged, as illustrated in FIG. 4. The barrier plate assembly 130 may further include a barrier plate frame 132 that covers sides of the barrier plates 131, if needed, as illustrated in FIG. 2.

The plurality of barrier plates 131 may be arranged parallel to each other at equal intervals in the X-axis direction. In addition, each of the barrier plates 131 may be arranged parallel to the YZ plane in FIG. 2, and may have a rectangular shape.

The barrier plates 131 may be respectively disposed between adjacent deposition source nozzles 121. In other words, each of the deposition source nozzles 121 may be disposed between two adjacent barrier plates 131. In particular, the deposition source nozzles 121 may be respectively located at the midpoint between two adjacent barrier plates 131, as illustrated in FIGS. 2 and 4. In other words, each of the deposition source nozzles 121 may be disposed between two adjacent barrier plates 131. The deposition source nozzles 121 may be respectively located at the midpoint between two adjacent barrier plates 131.

As described above, since the barrier plates 131 partition the space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles slits 121, and passes through the patterning slits 151 so as to be deposited on the substrate 500.

In other words, the barrier plates 131 guide the deposition material 115, which is discharged through the deposition source nozzles slits 121, to move straight, i.e., in the Z-axis direction, not to flow in the X-axis direction.

As described above, the deposition material 115 is forced to move straighter in the Z direction by installing the barrier plates 131, so that a smaller shadow zone may be formed on the substrate 500 compared to the case where no barrier plates are installed. Thus, the thin film deposition assembly 100 and the substrate 500 can be separate from each other by a predetermined distance. This will be described later in detail.

The barrier plate frame 132, which forms sides of the barrier plates 131, maintains the positions of the barrier plates 131, and guides the deposition material 115, which is discharged through the deposition source nozzles 121, not to flow in the Y-axis direction.

The deposition source nozzle unit 120 and the barrier plate assembly 130 may be separate from each other by a predetermined distance. This may prevent the heat radiated from the deposition source unit 110 from being conducted to the barrier plate assembly 130. However, the present invention is not limited to this. In particular, an appropriate heat insulator (not shown) may be further disposed between the deposition source nozzle unit 120 and the barrier plate assembly 130. In this case, the deposition source nozzle unit 120 and the barrier plate assembly 130 may be bound together with the heat insulator therebetween. Alternatively, the deposition source nozzle unit 120 and the barrier plate assembly 130 may be disposed to contact each other without a heat insulator therebetween.

In addition, the barrier plate assembly 130 may be constructed to be detachable from the thin film deposition assembly 100. In the thin film deposition assembly 100 according to the current embodiment of the present invention, the deposition space is enclosed by using the barrier plate assembly 130, so that the deposition material 115 that remains undeposited is deposited mostly within the barrier plate assembly 130. Thus, since the barrier plate assembly 130 is constructed to be detachable from the thin film deposition assembly 100, when a large amount of the deposition material 115 lies in the barrier plate assembly 130 after a long deposition process, the barrier plate assembly 130 may be detached from the thin film deposition assembly 100 and then placed in a separate deposition material recycling apparatus in order to recover the deposition material 115. Due to the structure of the thin film deposition assembly 100 according to the present embodiment, the reuse rate of the deposition material 115 is increased, so that the deposition efficiency is improved, and thus the manufacturing costs are reduced.

As described above, the total number of patterning slits 151 may be greater than the total number of deposition source nozzles 121. In addition, there may be a greater number of patterning slits 151 than deposition source nozzles 121 disposed between two adjacent barrier plates 131. The number of patterning slits 151 may be equal to the number of deposition patterns to be formed on the substrate 500. Thus, a layer pattern corresponding to the patterning slits 151 may be deposited on the substrate 500 without using an additional mask.

In addition, the barrier plate assembly 130 and the patterning slit sheet 150 may be disposed to be separate from each other by a predetermined distance. Alternatively, the barrier plate assembly 130 and the patterning slit sheet 150 may be connected by a connection member 135. In particular, the temperature of the barrier plate assembly 130 may increase to 100° C. or higher due to the deposition source 110 whose temperature is high. Thus, in order to prevent the heat of the barrier plate assembly 130 from being conducted to the patterning slit sheet 150, the barrier plate assembly 130 and the patterning slit sheet 150 may be separate from each other by a predetermined distance. The barrier plate assembly 130 and the patterning slit sheet 150 may be separate from each other by a predetermined distance for reasons to be described later with reference to FIGS. 5A through 5C, in addition to the reason described above. This will be described later.

The thin film deposition apparatus including the thin film deposition assembly 100 may include a chuck 600 that fixedly supports the substrate 500. The thin film deposition assembly 100 is disposed to be separate from the substrate 500 on which the chuck 600 is fixed. The thin film deposition assembly 100 and the substrate 500 fixed on the chuck 600 are moved relative to each other while a thin film is deposited on the substrate 500. The chuck 600 may comprise an electrostatic chuck. Electrostatic chucks may comprise an electrode embedded in its main body formed of ceramic, wherein the electrode is supplied with power. Such an electrostatic chuck may fix the substrate 500 on a surface of the main body as a high voltage is applied to the electrode.

The thin film deposition apparatus will now be described in detail. As illustrated in FIG. 1, the chuck 600 fixedly supporting the substrate 500 is moved by a scanner 611. The scanner 611 includes a first support 613, a second support 614, a movement bar 615, and a first driving unit 616.

The first support 613 and the second support 614 are disposed to pass through a chamber (not shown). The first support 613 is vertically disposed in the upper portion of the chamber, and the second support 614 is horizontally disposed below the first support 613 in the chamber. As illustrated in FIG. 1, the first support 613 and the second support 614 may be disposed perpendicular to each other forming a bent structure. However, the present invention is not limited to this structure, and the first support 613 and the second support 614 may have any structure, provided that the first support 613 is disposed above the second support 614.

The movement bar 615 is movable along the first support 613. One end of the movement bar 615 is supported by the first support 613, and the other end of the movement bar 615 is supported by an edge of the chuck 600. The chuck 600 is supported by the movement bar 615 to be movable along the first support 613. A portion of the movement bar 615 supporting the chuck 600 is bent toward the thin film deposition assembly 100, and thus can move the substrate 500 closer to the thin film deposition assembly 100.

The first driving unit 616 is disposed between the movement bar 615 and the first support 613. The first driving unit 616 may include a roller 617 rolling along the first support 613. The first driving unit 616 moves the movement bar 615 along the first support 613. The first driving unit 616 may generate a driving force by itself or may transfer a driving force generated by a separate driving source to the movement bar 615. The first driving unit 616 may comprise any driving element, in addition to the roller 617, provided it can move the movement bar 615.

The thin film deposition assembly 100 may be mounted on the second support 614, as illustrated in FIG. 1. A second driving unit 618 is disposed on the second support 614, and is connected to the frame 155 of the patterning slit sheet 150 of the thin film deposition assembly 100 in order to precisely control alignment between the substrate 500 and the thin film deposition assembly 100. Such a precise alignment control may be performed in real time during deposition.

In the thin film deposition apparatus, in order to deposit the deposition material 115 that has been discharged from the deposition source 110 and passed through the deposition source nozzle unit 120 and the patterning slit sheet 151, onto the substrate 500 in a desired pattern, it is required to maintain the chamber in a high-vacuum state. In the structure of the thin film deposition apparatus, the deposition material 115 moves in a random direction immediately after being discharged from the deposition source 110, but is then guided by the barrier plates 131, which extend in the Z-axis direction, to move in the Z-axis direction. The deposition material 115 discharged in undesired directions may adhere to surfaces of the barrier plate assembly 130, i.e., the barrier plates 131, and may be more unlikely to collide with the deposition material 115 discharged straight, and thus, the deposition material 115 is forced to move in a straight direction.

The substrate 500 supported by the chuck 600 or the thin film deposition assembly 100 are movable relative to each other. For example, as illustrated in FIG. 2, the substrate 500 may be moved in the direction of the arrow A relative to the thin film deposition assembly 100.

In a conventional deposition method using a fine metal mask (FMM), the size of the FMM has to be greater or equal to the size of a substrate. Thus, the size of the FMM has to be increased as the substrate becomes larger. However, it is neither straightforward to manufacture a large FMM nor to extend an FMM to be accurately aligned with a pattern.

In order to overcome this and/or other problems, in the thin film deposition apparatus according to the current embodiment of the present invention, deposition may be performed while the thin film deposition assembly 100 or the substrate 500 is moved relative to the other. In other words, deposition may be continuously performed while the substrate 500, which is disposed to face the thin film deposition assembly 100, is moved in the Y-axis direction. In other words, deposition is performed in a scanning manner while the substrate 500 is moved in the direction of the arrow A in FIG. 2. Although the substrate 500 is illustrated as being moved in the Y-axis direction in FIG. 3 when deposition is performed, the present invention is not limited thereto. That is, deposition may be performed while the thin film deposition assembly 100 is moved in the Y-axis direction and the substrate 500 is fixed. Alternatively, both the deposition assembly 100 and the substrate may move relative to the other.

Thus, in the thin film deposition assembly 100 according to the current embodiment of the present invention, the patterning slit sheet 150 may be significantly smaller than an FMM used in a conventional deposition method. In other words, in the thin film deposition assembly 100 according to the current embodiment of the present invention, deposition is continuously performed, i.e., in a scanning manner while the substrate 500 is moved in the Y-axis direction. Thus, the length of the patterning slit sheet 150 in the Y-axis direction may be significantly less than the length of the substrate 500 provided the width of the patterning slit sheet 150 in the X-axis direction and the width of the substrate 500 in the X-axis direction are substantially equal to each other. However, even when the width of the patterning slit sheet 150 in the X-axis direction is less than the width of the substrate 500 in the X-axis direction, deposition may be performed on the entire substrate 500 in a scanning manner while the substrate 500 or the thin film deposition assembly 100 is moved relative to the other.

As described above, since the patterning slit sheet 150 may be formed to be significantly smaller than an FMM used in a conventional deposition method, it is relatively easy to manufacture the patterning slit sheet 150 used in the present invention. In other words, using the patterning slit sheet 150, which is smaller than an FMM used in a conventional deposition method, is more convenient in all processes, including etching and subsequent other processes, such as precise extension, welding, moving, and cleaning processes, compared to the conventional deposition method using the larger FMM. This is more advantageous for a relatively large display device or a relatively large mother glass.

In order to perform deposition while the thin film deposition assembly 100 or the substrate 500 is moved relative to the other as described above, the thin film deposition assembly 100 and the substrate 500 may be separate from each other by a predetermined distance. In other words, the patterning slit sheet 150 and the substrate 500 may be separate from each other by a predetermined distance. This will be described later in detail. In addition, in order to prevent the formation of a relatively large shadow zone on the substrate 500 when the patterning slit sheet 150 and the substrate 500 are separate from each other, the barrier plates 131 are arranged between the deposition source nozzle unit 120 and the patterning slit sheet 150 to force the deposition material 115 to move in a straight direction. Thus, the size of the shadow zone formed on the substrate 500 is sharply reduced.

In particular, in a conventional deposition method using an FMM, deposition is performed with the FMM in close contact with a substrate in order to prevent formation of a shadow zone on the substrate. However, when the FMM is used in close contact with the substrate, the contact may cause defects, such as scratches on patterns formed on the substrate. In addition, in the conventional deposition method, the size of the mask has to be the same as the size of the substrate since the mask cannot be moved relative to the substrate. Thus, the size of the mask has to be increased as display devices or mother glasses become larger. However, it is not easy to manufacture such a large mask.

In order to overcome this and/or other problems, in the thin film deposition assembly 100 according to the current embodiment of the present invention, the patterning slit sheet 150 is disposed to be separate from the substrate 500, which constitutes a target on which the deposition material 115 is to be deposited, by a predetermined distance. This may be facilitated by installing the barrier plates 131 to reduce the size of the shadow zone formed on the substrate 500.

As described above, when the patterning slit sheet 150 is manufactured to be smaller than the substrate 500, the pattern slit sheet 150 may be moved relative to the substrate 500 during deposition. Thus, it is no longer necessary to manufacture a large FMM like one used in the conventional deposition method. In addition, since the substrate 500 and the patterning slit sheet 150 are separate from each other, defects caused due to contact therebetween may be prevented. In addition, since it is unnecessary to contact the substrate 500 with the patterning slit sheet 150 during a deposition process, the manufacturing speed may be improved.

Figure 5A:
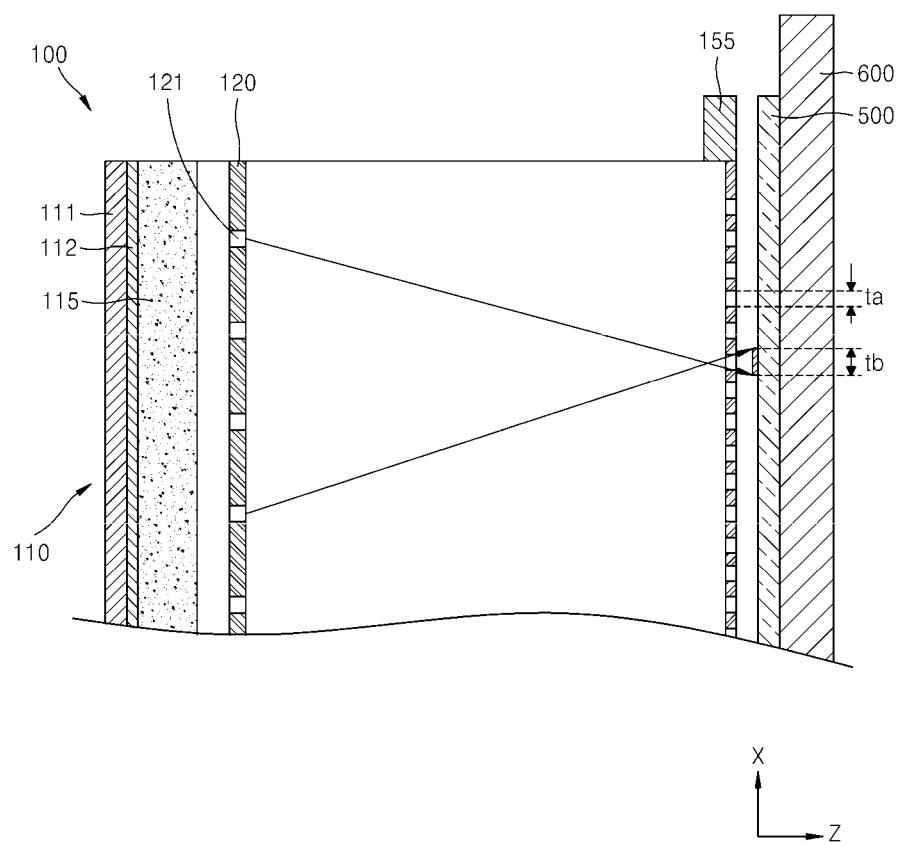
FIG. 5A is a view illustrating the width of a thin film deposited on a substrate when no barrier plate is used.

In addition, as described above, the barrier plates 131 are also separate from the patterning slit sheet 150. This will be described with reference to FIGS. 5A through 5C. FIG. 5A is a view illustrating the width of a thin film deposited on the substrate 500 when no barrier plate is used, FIG. 5B is a view illustrating the width of a thin film deposited on the substrate when barrier plates 131a are formed to extend to the patterning slit sheet 150, and FIG. 5C is a view illustrating the width of a thin film deposited on the substrate 500 using the thin film deposition assembly 100 of FIG. 2 in which the barrier plates 131 do not extend to the patterning slit sheet 150.

When no barrier plate is formed, as illustrated in FIG. 5A, the deposition material 115 that has just passed through the deposition source nozzles 121 may move toward the patterning slit sheet 150 in a random direction, i.e., not in a straight (Z) direction. Thus, a thin film having a width tb that is greater than a width ta of the patterning slits 151 is deposited on the substrate 500, as illustrated in FIG. 5A.

Figure 5B:
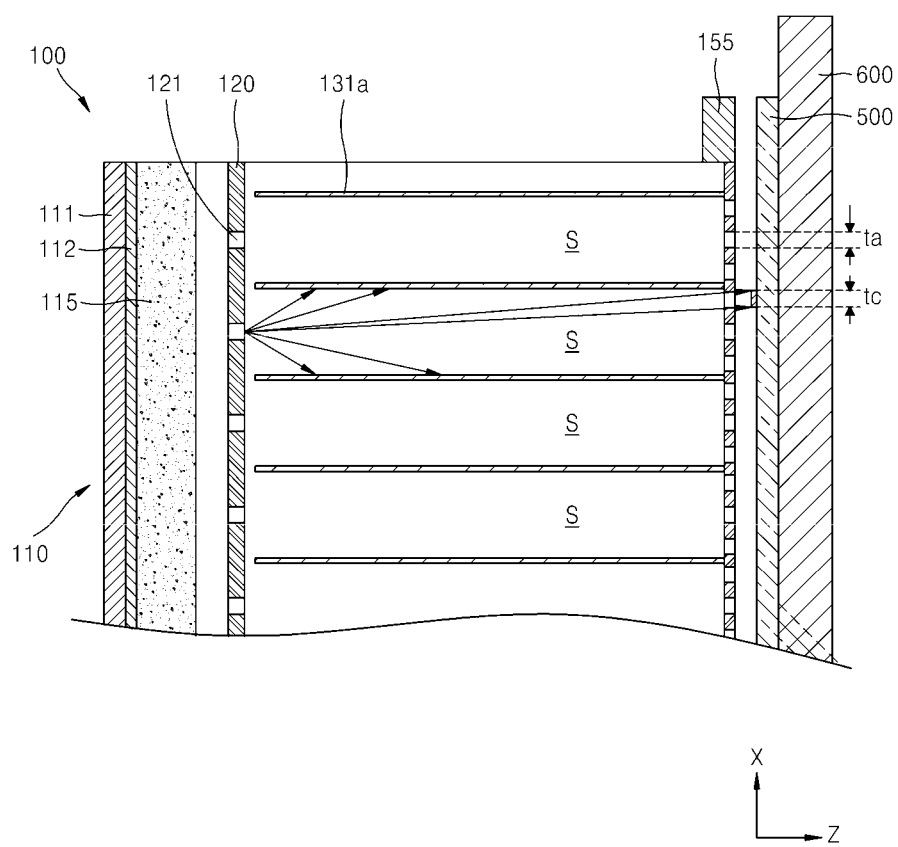
FIG. 5B is a view illustrating the width of a thin film deposited on a substrate when barrier plates are formed extending to a patterning slit sheet.

In order to prevent this, as illustrated in FIG. 5B, the barrier plates 131a may be formed to extend to the patterning slit sheet 150. In this case, the deposition material 115 that has passed through the deposition source nozzles 121 may adhere to the barrier plates 131a before reaching the patterning slit sheet 150. Thus, as illustrated in FIG. 5B, the deposition material 115 moving between the barrier plates 131a toward the patterning slit sheet 150 is forced to move straighter in the Z direction relative to the case of FIG. 5A, so that a thin film having a similar width tc to the width ta of the patterning slits 151 may be deposited on the substrate 500. However, a large amount of the deposition material 121 adheres to the barrier plates 131a after passing through the deposition source nozzles 121 and before reaching the patterning slit sheet 150 and therefore wasted until a thin film having a desired thickness is deposited on the substrate 500.

Figure 5C:
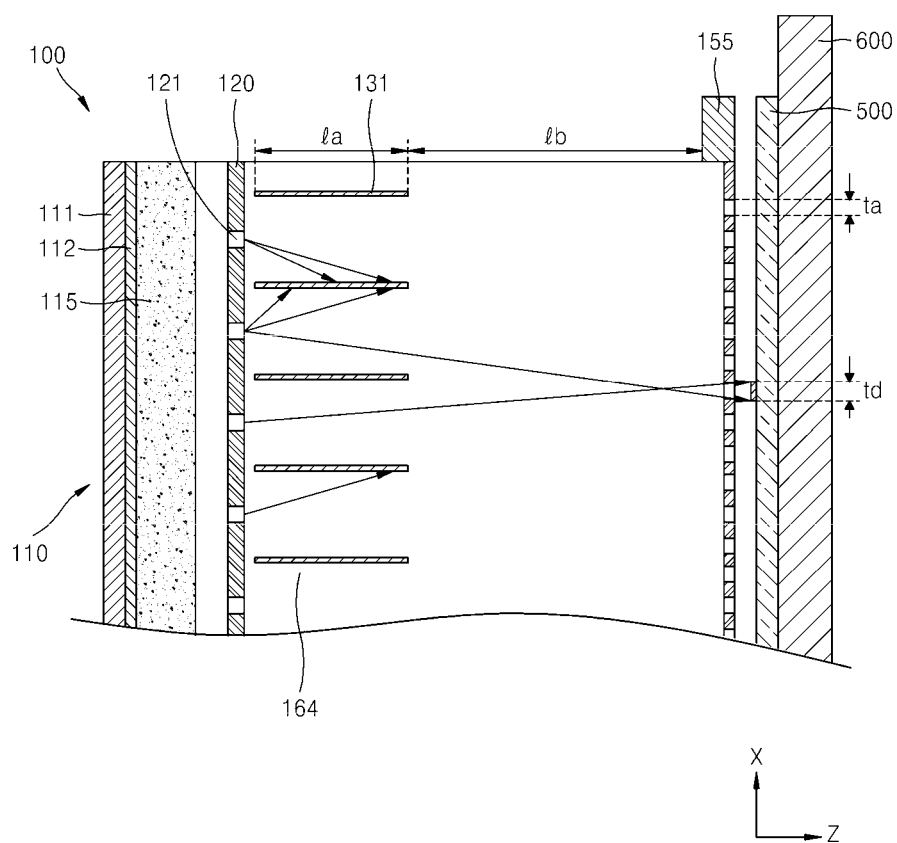
FIG. 5C is a view illustrating the width of a thin film deposited on a substrate using the thin film deposition assembly of FIG. 2.

Thus, in order to prevent this and/or other problems, in the thin film deposition assembly 100 according to the current embodiment of the present invention, the barrier plates 131 are disposed to be separate from the patterning slit sheet 150, as illustrated in FIG. 5C. In particular, the distance lb from the patterning slit sheet 150 to the ends of the barrier plates 131 closest to the patterning slit sheet 150 may be greater than the lengths la of the barrier plates 131.

Thus, as illustrated in FIG. 5C, the deposition material 115 is guided by the barrier plates 131 to reach the patterning slit sheet 150 at a restricted angle, so that a thin film having a width td substantially equal to the width ta of the patterning slits 151 may be deposited on the substrate 500. Furthermore, since the lengths la of the barrier plates 131 are less than the lengths of the barrier plates 131a illustrated in FIG. 5B, the amount of the deposition material 115 adhering to the barrier plates 131 may be markedly less compared to the case of FIG. 5B. Thus, the deposition material 115 passing through the deposition source nozzle unit 120 may be forced to move in a straighter direction, and the amount of the deposition material 115 adhering to the barrier plates 131 may be reduced, thereby markedly increasing utilization efficiency of the deposition material 115.

In addition, the thin film deposition assembly 100 may further include a barrier plates temperature control unit 160, as illustrated in FIGS. 2 through 4, if required. The barrier plates temperature control unit 160 maintains the barrier plates 131 at a low temperature while the thin film deposition assembly 100 deposits a thin film on the substrate 500 fixedly supported by the chuck 600, and at a high temperature while the thin film deposition assembly 100 does not deposit a thin film on the substrate 500 fixedly supported by the chuck 600.

When the barrier plates 131 are maintained at a low temperature, the deposition material 115 adheres to the barrier plates 131 and less vaporized deposition material 115 may move toward the patterning slit sheet 150. Thus, the vaporized deposition material 115 moving between the barrier plates 131 is forced to move straighter in the Z direction toward the patterning slit sheet 150. For this reason, the barrier plates 131 are maintained at a low temperature while the thin film deposition assembly 100 deposits a thin film on the substrate 500 fixedly supported by the chuck 600.

When the barrier plates 131 are maintained at a high temperature, the deposition material 115 may pass through between the barrier plates 131 without being adhered thereto. Furthermore, the deposition material 115 adhering to the barrier plates 131 at a low temperature may separate from the barrier plates 131 and be discharged from the thin film deposition assembly 100. For these reasons, when the thin film deposition assembly 100 does not deposit a thin film on the substrate 500 fixedly supported by the chuck 600, i.e., during idling of the thin film deposition assembly 100, the barrier plates 131 are maintained at a high temperature to discharge the deposition material 115 adhering to the barrier plates 131, and thus to significantly reduce the barrier plates 131 exchange cycle, that is, to increase the time necessary before barrier plates 131 must be exchanged.

As described above, the barrier plates temperature control unit 160 may control the temperature of the barrier plates 131 to be higher while the thin film deposition assembly 100 does not deposit a thin film on the substrate 500 fixedly supported by the chuck 600 than while the thin film deposition assembly 100 deposits a thin film on the substrate 500 fixedly supported by the chuck 600. In other words, in order to separate the deposition material 115 adhering to the barrier plates 131, the temperature of the barrier plates 131 may be maintained to be higher than the vaporization temperature, for example, about 200° C., of the deposition material 115 while the thin film deposition assembly 100 does not deposit a thin film on the substrate 500 fixedly supported by the chuck 600. The barrier plates temperature control unit 160 may maintain the temperature of the barrier plates 131 to be lower than the vaporization temperature, for example, about 200° C., of the deposition material 115 while the thin film deposition assembly 100 deposits a thin film on the substrate 500 fixedly supported by the chuck 600, in order to force the deposition material 115 to move in a straight direction.

To this end, the barrier plates temperature control unit 160 may include a cooling unit 163 and a heating unit 164, as illustrated in FIGS. 2 through 4. The cooling unit 163 may include cooling plates 161 and a cooling passage 162 in order to circulate a coolant. The heating unit 164 may include a hot wire. The cooling unit 163 may be constructed in various ways. For example, unlike as illustrated in FIGS. 2 through 4, the cooling unit 163 may be disposed in spaces inside the barrier plates 131 to circulate a coolant within the inner spaces of the barrier plates 131. In addition, the heating unit 164 may be disposed inside the barrier plates 131.

Figure 6:
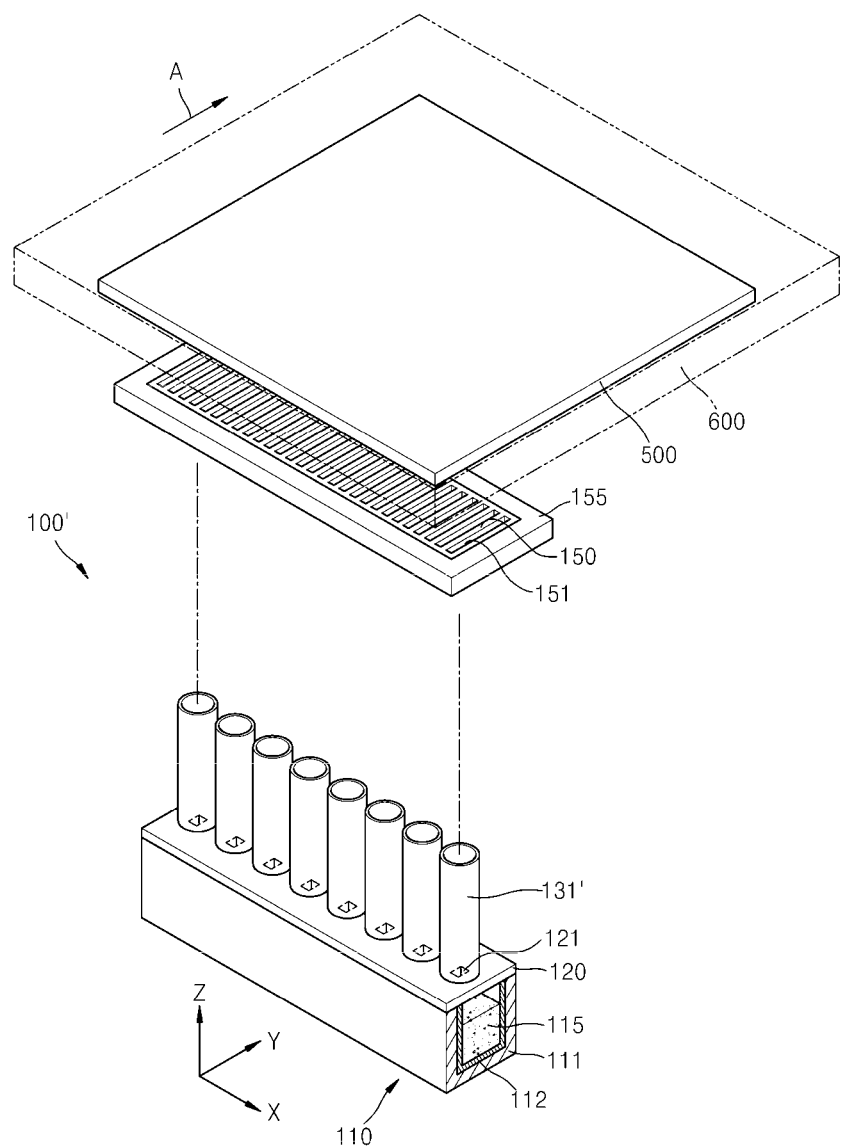
FIG. 6 is a schematic perspective view of a thin film deposition assembly of a thin film deposition apparatus according to another embodiment of the present invention.
Figure 7:
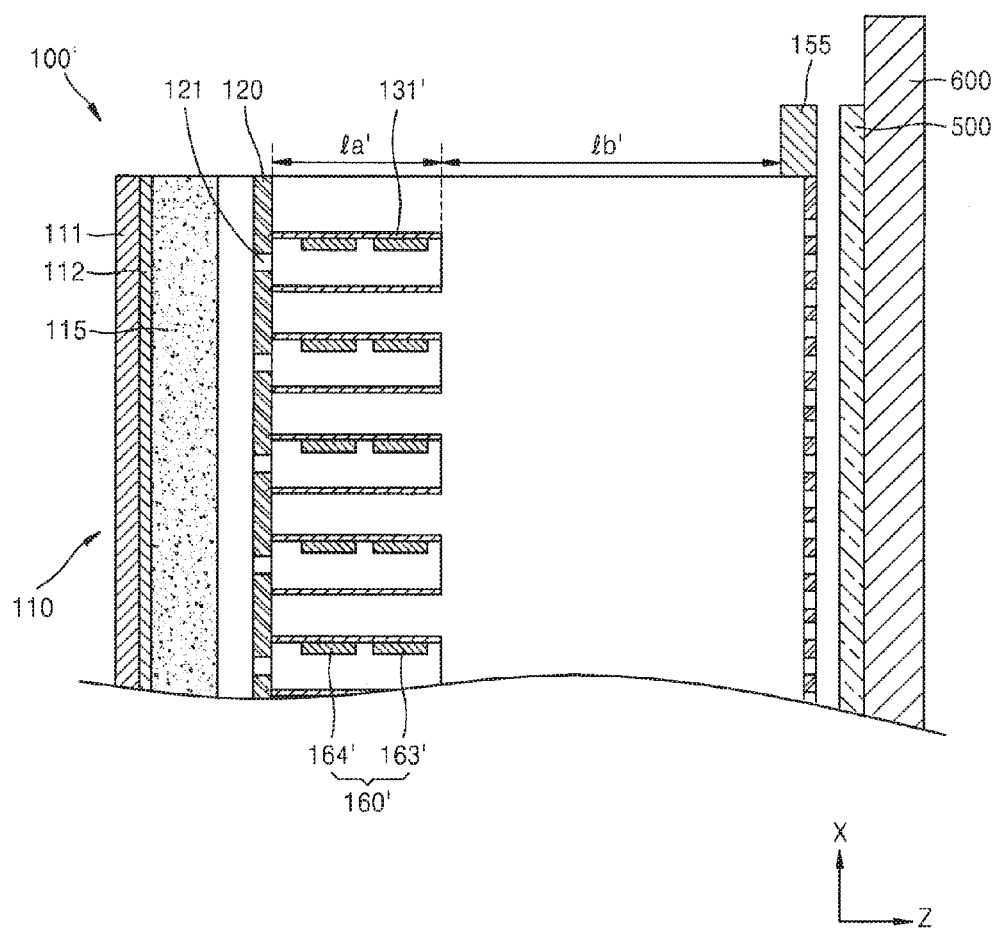
FIG. 7 is a schematic plan cross-sectional view of the thin film deposition assembly of FIG. 6.

FIG. 6 is a schematic perspective view of a thin film deposition assembly 100' of a thin film deposition apparatus according to another embodiment of the present invention, and FIG. 7 is a schematic plan cross-sectional view of the thin film deposition assembly 100' of FIG. 6. Hereinafter, for convenience of explanation, a detailed description of elements similar to the elements of the thin film deposition apparatus described in the previous embodiment, and functions or operations thereof, will not be provided here.

Referring to FIGS. 6 and 7, the thin film deposition assembly 100' according to the current embodiment of the present invention includes a deposition source 110 having an opening, wherein the deposition source 110 is filled with a deposition material 115 and discharges the deposition material 115. The deposition source nozzle unit 120, which has a planar shape, is disposed at a side of the deposition source 110 to cover the opening of the deposition source 110. The deposition source nozzle unit 120 includes a plurality of deposition source nozzles 121 arranged in a first direction, i.e., the X-axis direction in FIGS. 6 and 7.

The thin film deposition assembly 100' of the thin film deposition apparatus according to the current embodiment of the present invention includes a plurality of barrier pipes 131', instead of the plurality of barrier plates 131 (see FIG. 2) of the previous embodiment. The barrier pipes 131' are arranged on a surface of the deposition source nozzle unit 120 facing the patterning slit sheet 150, and respectively correspond to the deposition source nozzles 121. The plurality of barrier pipes 131' may be arranged at equal intervals.

The barrier pipes 131' are separate from the patterning slit sheet 150, like the barrier plates 131 described in the previous embodiment. The barrier pipes 131' may force the deposition material 115 discharged from the deposition source 110 through the deposition source nozzles 121 to move in a straight direction toward the patterning slit sheet 150. In addition, the amount of the deposition material 115 adhering to the barrier pipes 131' may be significantly less compared to when such barrier pipes are formed to extend to the patterning slit sheet 150, so that utilization efficiency of the deposition material 115 is markedly increased. In the current embodiment, the distance lb' from the patterning slit sheet 150 to the end of the barrier pipes 131' close to the patterning slit sheet 150 may be greater than the length la' of the barrier pipes 131', as illustrated in FIG. 7.

In addition, the thin film deposition apparatus according to the current embodiment of the present invention may include the chuck 600 that fixedly supports the substrate 500, and the thin film deposition assembly 100' deposits a thin film on the substrate 500 fixedly supported by the chuck 600. In this case, the thin film deposition assembly 100' is disposed to be separate from the substrate 500 fixedly supported by the chuck 600, and the thin film deposition assembly 100' or the substrate 500 fixedly supported by the chuck 600 move relative to each other.

The thin film deposition assembly 100' may further include a barrier pipes temperature control unit 160' that controls the temperature of the barrier pipes 131. For example, the temperature of the barrier pipes 131' may be lowered by circulating a coolant along the inner walls of some of the barrier pipes 131', and may be increased by installing hot-wires 164' in some of the barrier pipes 131'. In this case, a structure 163' for circulating the coolant and the hot wires 164' may constitute the barrier pipes temperature control unit 160'. However, the barrier pipes temperature control unit is not limited to the structure described above, and may have various other structures. For example, the deposition source nozzle unit 120 may include a cooling plate in an inner space thereof to provide the effect of circulating a coolant, and the barrier pipes 131' may include a hot wire.

Such a barrier pipes temperature control unit maintains the barrier pipes 131' at a low temperature while the thin film deposition assembly 100' deposits a thin film on the substrate 500 fixedly supported by the chuck 600, and at a high temperature while the thin film deposition assembly 100' does not deposit a thin film on the substrate 500 fixedly supported by the chuck 600.

When the barrier pipes 131' are maintained at a low temperature, the deposition material 115 adheres to the barrier pipes 131' and less vaporized deposition material 115 may move toward the patterning slit sheet 150. Thus, the vaporized deposition material 115 in the barrier pipes 131' may be forced to move in straighter in the Z direction toward the patterning slit sheet 150. For this reason, the barrier pipes 131' are maintained at a low temperature while the thin film deposition assembly 100' deposits a thin film on the substrate 500 fixedly supported by the chuck 600.

When the barrier pipes 131' are maintained at a high temperature, the deposition material 115 may pass through the barrier pipes 131' without adhering thereto. Furthermore, the deposition material 115 adhering to the barrier pipes 131' at a low temperature may separate from the barrier pipes 131' and be discharged from the thin film deposition assembly 100'. For these reasons, when the thin film deposition assembly 100' does not deposit a thin film on the substrate 500 fixedly supported by the chuck 600, i.e., during idling of the thin film deposition assembly 100', the barrier pipes 131' are maintained at a high temperature to discharge the deposition material 115 adhering to the barrier pipes 131', and thus to significantly reduce the barrier pipes 131' exchange cycle.

As described above, the barrier pipes temperature control unit may control the temperature of the barrier pipes' 131 to be higher while the thin film deposition assembly 100' does not deposit a thin film on the substrate 500 fixedly supported by the chuck 600 than while the thin film deposition assembly 100' deposits a thin film on the substrate 500 fixedly supported by the chuck 600. In other words, in order to separate the deposition material 115 adhering to the barrier pipes 131', the temperature of the barrier pipes 131' may be maintained to be higher than the vaporization temperature, for example, about 200° C., of the deposition material 115 while the thin film deposition assembly 100' does not deposit a thin film on the substrate 500 fixedly supported by the chuck 600. The barrier pipes temperature control unit may maintain the temperature of the barrier pipes 131' to be lower than the vaporization temperature, for example, about 200° C., of the deposition material 115 while the thin film deposition assembly 100' deposits a thin film on the substrate 500 fixedly supported by the chuck 600, in order to force the deposition material 115 to move straighter in the Z direction.

Figure 8:
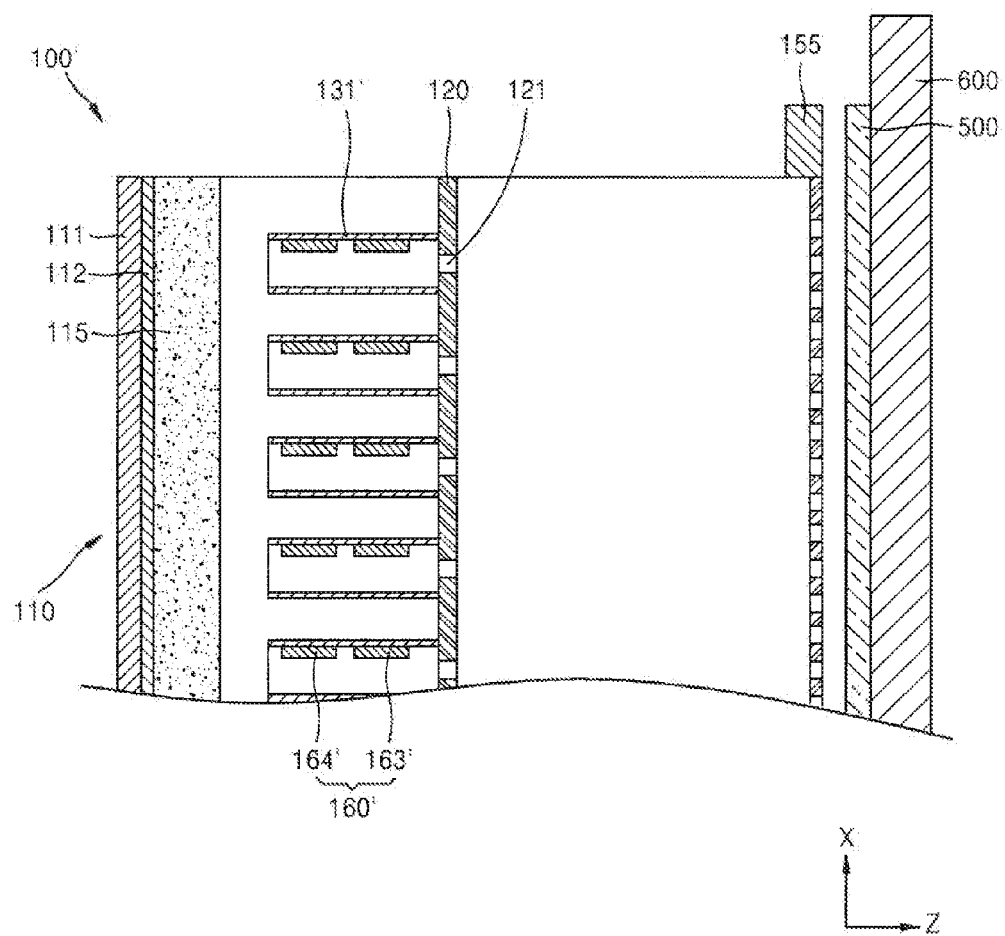
FIG. 8 is a schematic plan cross-sectional view of a thin film deposition assembly of a thin film deposition apparatus according to another embodiment of the present invention.

FIG. 8 is a schematic plan cross-sectional view of a thin film deposition assembly 100' according to another embodiment of the present invention. A difference between the thin film deposition assembly 100' of the thin film deposition apparatus according to the present invention and the thin film deposition apparatus 100' described in the previous embodiment with reference to FIGS. 6 and 7 is the location of the barrier pipes 131'. In the thin film deposition assembly 100' of the thin film deposition apparatus according to the current embodiment of the present invention, the barrier pipes 131' are arranged on a surface of the deposition source nozzle unit 120 forming an inner wall of the deposition source 110. Thus, the deposition material 115 that has entered the barrier pipes 131' within the deposition source 110 may be forced to move straighter in the Z direction toward the patterning slit sheet 150.

The thin film deposition assembly 100' according to the current embodiment of the present invention may further include a barrier pipes temperature control unit 160'. For example, the temperature of the barrier pipes 131' may be lowered by circulating a coolant along the inner walls of some of the barrier pipes 131, and may be increased by installing hot wires 164 in some of the barrier pipes 131'. In this case, a structure 163' for circulating the coolant and the hot wires 164' may constitute the barrier pipes temperature control unit 160'. However, the barrier pipes temperature control unit is not limited to the structure described above, and may have various other structures. For example, the deposition source nozzle unit 120 may include a cooling plate in an inner space thereof to provide an effect of circulating a coolant, and the barrier pipes 131' may include a hot wire.

Such a barrier pipes temperature control unit maintains the barrier pipes 131' at a low temperature while the thin film deposition assembly 100' deposits a thin film on the substrate 500 fixedly supported by the chuck 600, and at a high temperature while the thin film deposition assembly 100' does not deposit a thin film on the substrate 500 fixedly supported by the chuck 600.

When the barrier pipes 131' are maintained at a low temperature, the deposition material 115 adheres to the barrier pipes 131' and less vaporized deposition material 115 may move toward the patterning slit sheet 150. Thus, the vaporized deposition material 115 in the barrier pipes 131' may be forced to move straighter in the Z direction toward the patterning slit sheet 150. For this reason, the barrier pipes 131' are maintained at a low temperature while the thin film deposition assembly 100' deposits a thin film on the substrate 500 fixedly supported by the chuck 600.

When the barrier pipes 131' are maintained at a high temperature, the vaporized deposition material 115 may pass through the barrier pipes 131' without adhering thereto. Furthermore, the deposition material 115 adhered to the barrier pipes 131' at a low temperature may separate from the barrier pipes 131' and be discharged from the thin film deposition assembly 100'. For these reasons, when the thin film deposition assembly 100' does not deposit a thin film on the substrate 500 fixedly supported by the chuck 600, i.e., during idling of the thin film deposition assembly 100', the barrier pipes 131' are maintained at a high temperature to discharge the deposition material 115 adhered to the barrier pipes 131', and thus to significantly reduce a barrier pipes exchange cycle.

As described above, the barrier pipes temperature control unit may control the temperature of the barrier pipes' 131 to be higher while the thin film deposition assembly 100' does not deposit a thin film on the substrate 500 fixedly supported by the chuck 600 than while the thin film deposition assembly 100' deposits a thin film on the substrate 500 fixedly supported by the chuck 600. In other words, in order to separate the deposition material 115 adhering to the barrier pipes 131', the temperature of the barrier pipes 131' may be maintained to be higher than a vaporization temperature, for example, about 200° C., of the deposition material 115 while the thin film deposition assembly 100' does not deposit a thin film on the substrate 500 fixedly supported by the chuck 600. The barrier pipes temperature control unit may maintain the temperature of the barrier pipes 131' to be lower than the vaporization temperature, for example, about 200° C., of the deposition material 115 while the thin film deposition assembly 100' deposits a thin film on the substrate 500 fixedly supported by the chuck 600, in order to force the deposition material 115 to move in a straight direction.

Figure 9:
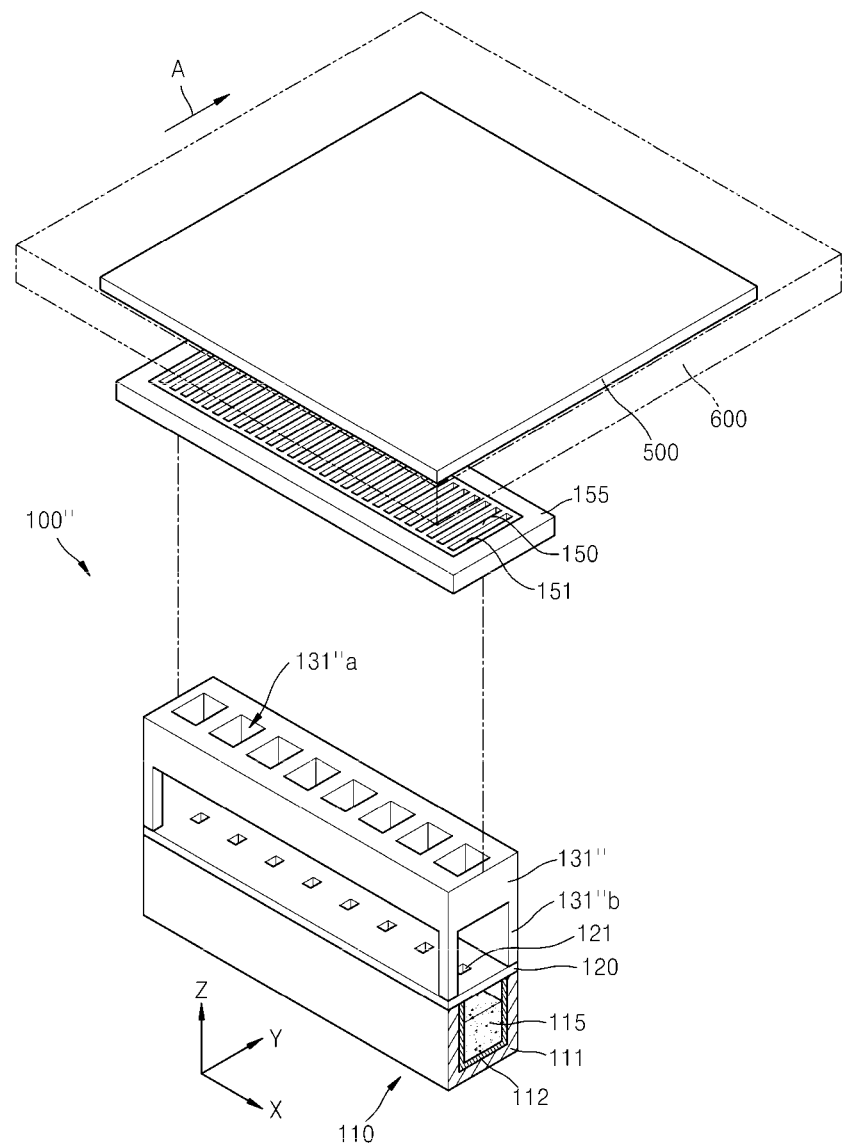
FIG. 9 is a schematic perspective view of a thin film deposition assembly of a thin film deposition apparatus according to another embodiment of the present invention.
Figure 10:
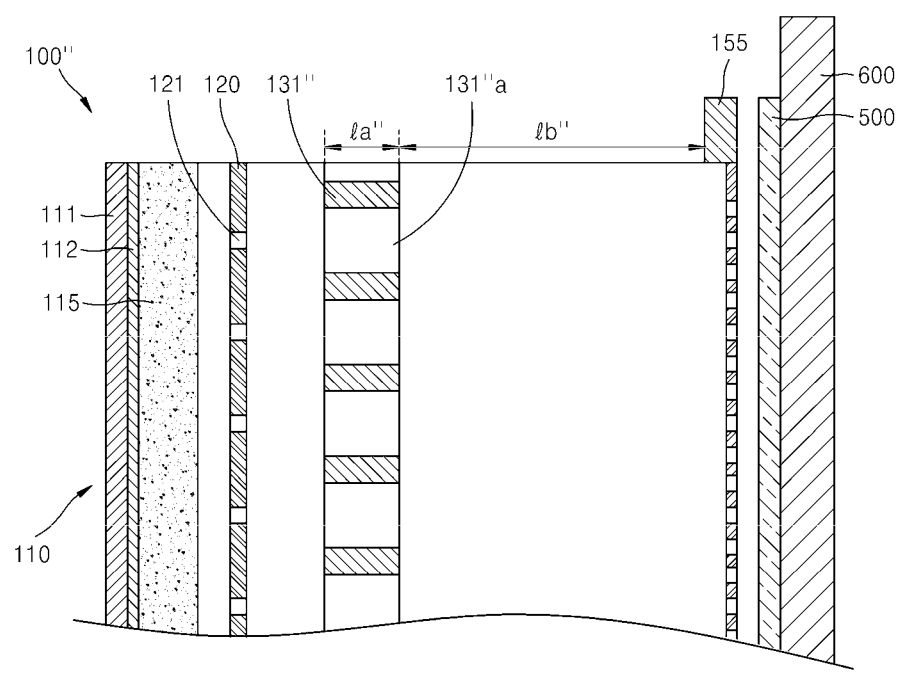
FIG. 10 is a schematic plan cross-sectional view of the thin film deposition assembly of FIG. 9.

FIG. 9 is a schematic perspective view of a thin film deposition assembly 100" of a thin film deposition apparatus according to another embodiment of the present invention, and FIG. 10 is a schematic plan cross-sectional view of the thin film deposition assembly 100" of FIG. 9. Hereinafter, for convenience of explanation, a detailed description of elements similar to the elements of the thin film deposition apparatuses described in the previous embodiments, and functions or operation thereof, will not be provided here.

Referring to FIGS. 9 and 10, the thin film deposition assembly 100" according to the current embodiment of the present invention includes a deposition source 110 having an opening, wherein the deposition source 110 is filled with a deposition material 115 and discharges the deposition material 115. The deposition source nozzle unit 120, which has a planar shape, is disposed at a side of the deposition source 110 to cover the opening of the deposition source 110. The deposition source nozzle unit 120 includes a plurality of deposition source nozzles 121 arranged in a first direction, i.e., the X-axis direction in FIGS. 9 and 10.

The thin film deposition assembly 100" of the thin film deposition apparatus according to the current embodiment of the present invention includes a barrier nozzle unit 131", instead of the plurality of barrier plates 131 (see FIG. 2) or the plurality of barrier pipes 131' (see FIG. 6) of the previous embodiments. The barrier nozzle unit 131" is arranged on a surface of the deposition source nozzle unit 120 facing the patterning slit sheet 150. The barrier nozzle unit 131" may include a plurality of barrier nozzles 131″*a* arranged to respectively correspond to the deposition source nozzles 121.

The barrier nozzle unit 131″ is separate from the patterning slit sheet 150, like the barrier plates 131 or the barrier pipes 131' described in the previous embodiments. The barrier nozzle unit 131″ may force the deposition material 115 discharged through the deposition source nozzle unit 120 from the deposition source to move straighter in the Z direction toward the patterning slit sheet 150. In addition, since the barrier nozzle unit 131″ does not fully extend between the deposition source nozzle unit 120 and the patterning slit sheet 150, the amount of the deposition material 115 adhering to inner walls of the barrier nozzle unit 131″ may be significantly less, thereby markedly increasing utilization efficiency of the deposition material 115. In the current embodiment, the distance lb″ from the patterning slit sheet 150 to an end of the barrier nozzle unit 131″ close to the patterning slit sheet 150 may be greater than the length la″ of the barrier nozzle unit 131″, as illustrated in FIG. 10.

In addition, the thin film deposition apparatus according to the current embodiment of the present invention may include the chuck 600 that fixedly supports the substrate 500, and the thin film deposition assembly 100″ deposits a thin film on the substrate 500 fixedly supported by the chuck 600. In this case, the thin film deposition assembly 100″ is disposed to be separate from the substrate 500 fixedly supported by the chuck 600, and the thin film deposition assembly 100″ or the substrate 500 fixedly supported by the chuck 600 is moved relative to each other.

The thin film deposition assembly 100″ may further include a barrier nozzle temperature control unit (not shown) that controls the temperature of the barrier nozzle unit 131″. For example, the temperature of the barrier nozzle unit 131″ may be lowered by circulating a coolant within the barrier nozzle unit 131″, and may be increased by installing a hot wire in the barrier nozzle unit 131″. In this case, a structure for circulating the coolant and the hot wire may constitute the barrier nozzle temperature control unit. However, the barrier nozzle temperature control unit is not limited to the structure described above, and may have various other structures. For example, the deposition source nozzle unit 120 may include a cooling plate in an inner space thereof to offer an effect of circulating a coolant, and the barrier nozzle unit 131″ may include a hot wire.

Such a barrier nozzle temperature control unit maintains the barrier nozzle unit 131″ at a low temperature while the thin film deposition assembly 100″ deposits a thin film on the substrate 500 fixedly supported by the chuck 600, and at a high temperature while the thin film deposition assembly 100″ does not deposit a thin film on the substrate 500 fixedly supported by the chuck 600.

When the barrier nozzle unit 131″ is maintained at a low temperature, deposition material 115 adheres to the barrier nozzle unit 131″ and less vaporized deposition material 115 may move toward the patterning slit sheet 150. Thus, the vaporized deposition material 115 passing the barrier nozzle unit 131″ is forced to move straighter in the Z direction toward the patterning slit sheet 150. For this reason, the barrier nozzle unit 131″ is maintained at a low temperature while the thin film deposition assembly 100″ deposits a thin film on the substrate 500 fixedly supported by the chuck 600.

When the barrier nozzle unit 131″ is maintained at a high temperature, the vaporized deposition material 115 may pass through the barrier nozzle unit 131″ without adhering thereto. Furthermore, the deposition material 115 already adhering to the barrier nozzle unit 131″ at a low temperature may separate from the barrier nozzle unit 131″ and be discharged from the thin film deposition assembly 100″. For these reasons, when the thin film deposition assembly 100″ does not deposit a thin film on the substrate 500 fixedly supported by the chuck 600, i.e., during idling of the thin film deposition assembly 100″, the barrier nozzle unit 131″ is maintained at a high temperature to discharge the deposition material 115 adhered to the barrier nozzle unit 131'1, and thus to significantly reduce a barrier nozzle unit exchange cycle.

As described above, the barrier nozzle temperature control unit may control the temperature of the barrier nozzle unit 131″ to be higher while the thin film deposition assembly 100″ does not deposit a thin film on the substrate 500 fixedly supported by the chuck 600 than while the thin film deposition assembly 100″ deposits a thin film on the substrate 500 fixedly supported by the chuck 600. In other words, in order to separate the deposition material 115 adhering to the barrier nozzle unit 131″, the temperature of the barrier nozzle unit 131″ may be maintained to be higher than the vaporization temperature, for example, about 200° C., of the deposition material 115 while the thin film deposition assembly 100″ does not deposit a thin film on the substrate 500 fixedly supported by the chuck 600. The barrier nozzle temperature control unit may maintain the temperature of the barrier nozzle unit 131″ to be lower than the vaporization temperature, for example, about 200° C., of the deposition material 115 while the thin film deposition assembly 100″ deposits a thin film on the substrate 500 fixedly supported by the chuck 600, in order to force the deposition material 115 to move straighter in the Z direction.

In addition, as illustrated in FIG. 9, the barrier nozzle unit 131″ may include projections 131″*b* protruding toward the deposition source nozzle unit 120. The projections 131″*b* separate the main body of the barrier nozzle unit 131″ from the deposition source 110.

Figure 11:
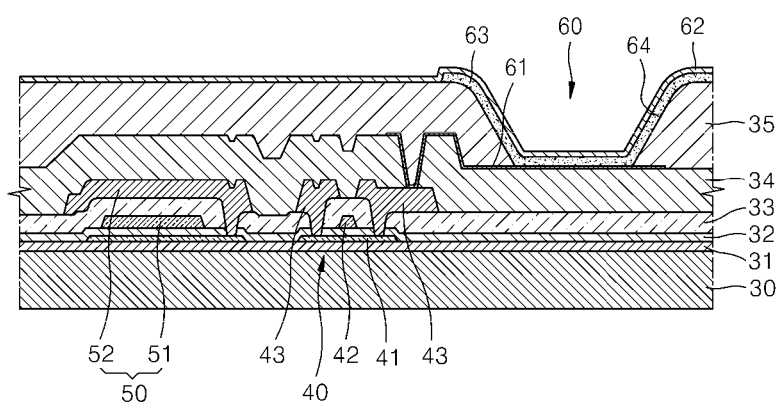
FIG. 11 is a schematic cross-sectional view of an organic light-emitting display device manufactured by using a thin film deposition apparatus according to another embodiment of the present invention.

An active matrix organic light-emitting display device may be manufactured using such a thin film deposition apparatus described in the previous embodiments. FIG. 11 is a schematic cross-sectional view of an active matrix organic light-emitting display device manufactured by using such a thin film deposition apparatus described above, according to an embodiment of the present invention.

Referring to FIG. 11, the active matrix organic light-emitting display device according to the current embodiment is disposed on a substrate 30. The substrate 30 may be formed of a transparent material, for example, glass, plastic or metal. An insulating layer 31, such as a buffer layer, is formed on an entire surface of the substrate 30. A thin film transistor (TFT) 40, a capacitor 50, and an organic light-emitting diode 60 (OLED) are disposed on the insulating layer 31, as illustrated in FIG. 11.

A semiconductor active layer 41 is formed on an upper surface of the insulating layer 31 in a predetermined pattern. A gate insulating layer 32 is formed to cover the semiconductor active layer 41. The semiconductor active layer 41 may include a p-type or n-type semiconductor material.

A gate electrode 42 of the TFT 40 is formed in a region of the gate insulating layer 32 corresponding to the semiconductor active layer 41. An interlayer insulating layer 33 is formed to cover the gate electrode 42. The interlayer insulating layer 33 and the gate insulating layer 32 are etched by, for example, dry etching, to form a contact hole exposing parts of the semiconductor active layer 41.

A source/drain electrode 43 is formed on the interlayer insulating layer 33 to contact the semiconductor active layer 41 through the contact hole. A passivation or protective layer 34 is formed to cover the source/drain electrode 43, and is etched to expose a part of the drain electrode 43. An insulating layer (not shown) may be further formed on the protective layer 34 so as to planarize the protective layer 34.

In addition, the OLED 60 displays predetermined image information by emitting red, green, or blue light as current flows. The OLED 60 includes a first electrode 61 formed on the protective layer 34. The first electrode 61 is electrically connected to the drain electrode 43 of the TFT 40.

A pixel defining layer 35 is formed to cover the first electrode 61. An opening 64 is formed in the pixel defining layer 35, and an intermediate layer 63, including an emission layer, is formed in a region defined by the opening 64. A second electrode 62 is formed on the intermediate layer 63.

The pixel defining layer 35, which defines individual pixels, is formed of an organic material. The pixel defining layer 35 also planarizes the surface of a region of the substrate 30 where the first electrode 61 is formed, and in particular, the surface of the protective layer 34. The first electrode 61 and the second electrode 62 are insulated from each other, and respectively apply voltages of opposite polarities to the intermediate layer 63, including the emission layer, to induce light emission.

The intermediate layer 63 may be formed of a low-molecular weight organic material or a high-molecular weight organic material. When a low-molecular weight organic material is used, the intermediate layer 63 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (α-NPB), tris-8-hydroxyquinoline aluminum (Alq3), and the like. Such a low-molecular weight organic material may be deposited by vacuum deposition using one of the thin film deposition apparatuses described above with reference to FIGS. 1 through 6.

Once the opening 64 has been formed in the pixel defining layer 35, the substrate 30 is transferred to a chamber (not shown). Then, the intermediate layer 63, including the emission layer, is formed using one of the thin film deposition apparatuses according to the embodiments of the present invention described above. After the intermediate layer 63 is formed, the second electrode 62 may be formed by the same deposition method as used to form the intermediate layer 63.

The first electrode 61 functions as an anode, and the second electrode 62 functions as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. Such a transparent electrode may include a layer formed from indium tin oxide (ITO), indium zinc oxide (IZO), zinc oxide (ZnO), or indium oxide ($In_2O_3$). Such a reflective electrode may include a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof, and a transparent electrode layer formed from ITO, IZO, ZnO, or $In_2O_3$. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 functions as a cathode. To this end, such a transparent electrode may be formed by depositing a metal or metal salt material having a low work function, such as lithium (Li), calcium (Ca), lithium fluoride/calcium (LiF/Ca), lithium fluoride/aluminum (LiF/Al), aluminum (Al), silver (Ag), magnesium (Mg), or a combination thereof on a surface of the intermediate layer 63 and forming an auxiliary electrode layer or a bus electrode line thereon from ITO, IZO, ZnO, $In_2O_3$, or the like. When the second electrode 62 is formed as a reflective electrode, the reflective layer may be formed by depositing Li, Ca, LiF/Ca, LiF/Al, Al, Ag, Mg, or a combination thereof on the entire surface of the intermediate layer 63. The second electrode 62 may be formed by using the same deposition method as used to form the intermediate layer 63 described above. The thin film deposition apparatuses according to the embodiments of the present invention described above may be applied to form an organic layer or an inorganic layer of an organic TFT, and to form layers from various materials.

As described above, a thin film deposition apparatus according to the present invention is suitable for manufacturing large-sized display devices on a mass scale and can be used for high-definition patterning. The thin film deposition apparatus according to the present invention also may be used to manufacture an organic light-emitting display device.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic light-emitting display device by using a thin film deposition apparatus comprising a thin film deposition assembly, the thin film deposition assembly comprising:

a deposition source that comprises an opening and discharges a deposition material contained therein;

a deposition source nozzle unit that is disposed at a side of the deposition source and comprises a plurality of deposition source nozzles arranged in a first direction;

a patterning slit sheet that is disposed opposite to the deposition source nozzle unit and comprises a plurality of patterning slits arranged in the first direction;

a plurality of barrier pipes that are disposed on a surface of the deposition source nozzle unit facing the patterning slit sheet or on a surface of the deposition source nozzle unit opposite to the patterning slit sheet, the plurality of barrier pipes respectively corresponding to the plurality of deposition source nozzles, and the method comprising:

fixedly supporting a substrate by a chuck;

spacing the substrate from the patterning slit sheet and adjacent to the patterning slit sheet so that no element is interposed between the substrate and the patterning slit sheet;

depositing the deposition material on the substrate to form a thin film; and moving the thin film deposition assembly including the patterning slit sheet, or the substrate fixedly supported by the chuck relative to each other while depositing the deposition material on the substrate, wherein, in depositing the deposition material on the substrate, the deposition material is discharged from the deposition source and passed through the deposition source nozzle unit, the barrier pipes, and the patterning slit sheet.

2. The method of claim 1, further comprising controlling a temperature of the barrier pipes using a barrier pipes temperature control unit of the thin film deposition apparatus.

3. The method of claim 2, further comprising maintaining the temperature of the barrier pipes using the barrier pipes temperature control unit at a first temperature while depositing the thin film on the substrate, and at a second temperature higher than the first temperature while not depositing the thin film on the substrate.

4. The method of claim 2, further comprising controlling the temperature of the barrier pipes using the barrier pipes temperature control unit to be higher while not depositing the thin film on the substrate than while depositing the thin film on the substrate.

5. The method of claim 2, further comprising maintaining the temperature of the barrier pipes using the barrier pipes temperature control unit to be lower than a vaporization temperature of the deposition material while depositing the thin film on the substrate, and to be higher than the vaporization temperature of the deposition material while not depositing the thin film on the substrate.

6. The method of claim 1, wherein the plurality of barrier pipes are disposed on the surface of the deposition source nozzle unit facing the patterning slit sheet, a distance from the patterning slit sheet to an end of the barrier pipes closest to the patterning slit sheet being greater than a length of the barrier pipes, and wherein, in depositing the deposition material on the substrate, the deposition material is passed through the deposition source nozzle unit before being passed through the barrier pipes, and the deposition material is passed from the end of the barrier pipes to the patterning slit sheet through the distance that is greater than the length of the barrier pipes after being passed through the barrier pipes.

7. The method of claim 1, wherein the plurality of barrier pipes are arranged at equal intervals.

8. The method of claim 1, further comprising adjusting a temperature using at least one of a cooling plate of the deposition source nozzle unit or a hot wire of the barrier pipes.

9. The method of claim 1, wherein each of the barrier pipes is separate from the patterning slit sheet.

10. The method of claim 1, wherein the patterning slit sheet is smaller than the substrate in at least one of the first direction or a second direction perpendicular to the first direction.

11. The method of claim 1, wherein the deposition material discharged from the thin film deposition assembly is continuously deposited on the substrate while the substrate and the thin film deposition assembly are moved relative to each other in a second direction perpendicular to the first direction.

* * * * *